(12) United States Patent
Nam

(10) Patent No.: US 11,004,854 B2
(45) Date of Patent: May 11, 2021

(54) SEMICONDUCTOR DEVICE AND METHOD OF FABRICATING THE SAME

(71) Applicant: Samsung Electronics Co., Ltd., Suwon-si (KR)

(72) Inventor: Ki-Hyung Nam, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/423,203

(22) Filed: May 28, 2019

(65) Prior Publication Data

US 2020/0161305 A1 May 21, 2020

(30) Foreign Application Priority Data

Nov. 16, 2018 (KR) ........................ 10-2018-0141459

(51) Int. Cl.
| | |
|---|---|
| *H01L 27/108* | (2006.01) |
| *H01L 21/308* | (2006.01) |
| *H01L 29/06* | (2006.01) |
| *H01L 29/423* | (2006.01) |

(52) U.S. Cl.
CPC .... *H01L 27/10823* (2013.01); *H01L 21/3086* (2013.01); *H01L 27/10855* (2013.01); *H01L 27/10876* (2013.01); *H01L 29/0649* (2013.01); *H01L 29/4236* (2013.01)

(58) Field of Classification Search
CPC ......... H01L 27/10823; H01L 27/10876; H01L 21/3086; H01L 29/0649; H01L 29/4236; H01L 27/10855; H01L 27/10814; H01L 27/10805; H01L 27/10847; H01L 27/10873
See application file for complete search history.

(56) References Cited

U.S. PATENT DOCUMENTS

| | | | |
|---|---|---|---|
| 7,368,348 B2 | 5/2008 | Lee | |
| 8,486,819 B2 | 7/2013 | Kim | |
| 8,975,140 B2* | 3/2015 | Chung | ............. H01L 21/76224 |
| | | | 438/270 |
| 9,330,978 B2 | 5/2016 | Taniguchi | |
| 9,362,422 B2 | 6/2016 | Lim | |
| 9,853,031 B1 | 12/2017 | Cho et al. | |
| 9,905,659 B2 | 2/2018 | Lee et al. | |
| 9,972,627 B2 | 5/2018 | Jang et al. | |
| 2005/0087776 A1* | 4/2005 | Kim | ................. H01L 29/66621 |
| | | | 257/262 |

(Continued)

*Primary Examiner* — Marcos D. Pizarro
*Assistant Examiner* — Sue Tang
(74) *Attorney, Agent, or Firm* — Muir Patent Law, PLLC

(57) ABSTRACT

A semiconductor device includes an active region in a substrate, an isolation film defining the active region in the substrate, a gate trench extending across the active region and the isolation film and including a first trench in the active region and a second trench in the isolation film, a gate electrode including a main gate electrode and a pass gate electrode, the main gate electrode filling a lower part of the first trench, and the pass gate electrode filling a lower part of the second trench, a support structure on the pass gate electrode, the support structure filling an upper part of the second trench, a gate insulating film interposed between the isolation film and the pass gate electrode and between the support structure and the pass gate electrode.

19 Claims, 34 Drawing Sheets

(56) References Cited

U.S. PATENT DOCUMENTS

| | | | |
|---|---|---|---|
| 2007/0267676 A1* | 11/2007 | Kim | H01L 29/7851 257/311 |
| 2011/0003459 A1* | 1/2011 | Shin | H01L 29/4236 438/430 |
| 2015/0028406 A1* | 1/2015 | Tang | H01L 29/0653 257/296 |
| 2015/0123238 A1* | 5/2015 | Jang | H01L 27/10823 257/503 |
| 2016/0284640 A1 | 9/2016 | Wang et al. | |
| 2018/0108662 A1* | 4/2018 | Cho | H01L 29/0649 |

\* cited by examiner

SEMICONDUCTOR DEVICE AND METHOD OF FABRICATING THE SAME

This application claims priority under 35 U.S.C. 119 to Korean Patent Application No. 10-2018-0141459, filed on Nov. 16, 2018 in the Korean Intellectual Property Office, the disclosure of which is incorporated herein by reference in its entirety.

BACKGROUND

1. Technical Field

The present inventive concept relates to a semiconductor device and a method of fabricating the same. More specifically, the present inventive concept relates to a semiconductor device including a buried channel array transistor and a method of fabricating the same.

2. Description of the Related Art

As semiconductor memory devices are increasingly highly integrated, individual circuit patterns have been further miniaturized in order to implement more semiconductor devices on the same area. On the other hand, the buried channel array transistor (BCAT) may minimize a short channel effect, by including a gate electrode buried in a trench.

SUMMARY

Aspects of the present inventive concept provide a semiconductor device with improved product reliability and performance.

Aspects of the present inventive concept also provide a method for fabricating the semiconductor device capable of fabricating the semiconductor device with improved product reliability and performance.

However, aspects of the present inventive concept are not restricted to the ones set forth herein. The above and other aspects of the present inventive concept will become more apparent to one of ordinary skill in the art to which the present inventive concept pertains by referencing the detailed description of the present inventive concept given below.

According to an exemplary embodiment of the present inventive concept, a semiconductor device includes an active region in a substrate, an isolation film defining the active region in the substrate, a gate trench extending across the active region and the isolation film and including a first trench in the active region and a second trench in the isolation film, a gate electrode including a main gate electrode and a pass gate electrode, the main gate electrode filling a lower part of the first trench, and the pass gate electrode filling a lower part of the second trench, a support structure on the pass gate electrode, the support structure filling an upper part of the second trench, a gate insulating film interposed between the isolation film and the pass gate electrode and between the support structure and the pass gate electrode.

According to an exemplary embodiment of the present inventive concept, a semiconductor device includes an active region including a first trench extending in a first direction inside a substrate, an isolation film including a second trench extending in the first direction inside the substrate and defining the active region, a main gate electrode filling a lower part of the first trench, a first gate insulating film between the active region and the main gate electrode, a pass gate electrode filling a lower part of the second trench, and a second gate insulating film between the isolation film and the pass gate electrode. The first gate insulating film extends along a bottom surface and a sidewall of the main gate electrode. The second gate insulating film extends along a bottom surface, a sidewall, and an upper surface of the pass gate electrode.

According to an exemplary embodiment of the present inventive concept, a semiconductor device includes an active region extending in a first direction inside a substrate, an isolation film defining the active region inside the substrate, a gate trench in the active region and the isolation film, the gate trench extending in a second direction at a first acute angle with respect to the first direction, a gate electrode which fills a lower part of the gate trench, a support structure on the gate electrode, the support structure filling an upper part of the gate trench in the isolation film, and a gate insulating film which extends along sidewalls and a bottom surface of the gate trench. The support structure includes a first sidewall intersecting the second direction. The gate insulating film further extends along a bottom surface and the first sidewall of the support structure.

According to an exemplary embodiment of the present inventive concept, a method of fabricating a semiconductor device is provided as follow. An active region and an isolation film defining the active region are formed in a substrate. A gate trench extending across the active region and the isolation film is formed in the substrate, the gate trench including a first trench in the active region and a second trench in the isolation film. A sacrificial film is formed to fill the gate trench. A portion of the sacrificial film in an upper part of the second trench is replaced with a support structure. The remaining portion of the sacrificial film in a lower part of the second trench is removed to form a gap defined by a bottom surface of the support structure and an inner sidewall of the second trench. A gate insulating film and a gate electrode are sequentially formed on the bottom surface of the support structure and the inner sidewall of the gate trench.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Hereinafter, a semiconductor device according to some embodiments of the present inventive concept will be described with reference to FIGS. 1 to 14. Although a DRAM (dynamic random access memory) is illustrated as an example of the semiconductor device according to some embodiments, the present disclosure is not limited thereto.

Figure 1:
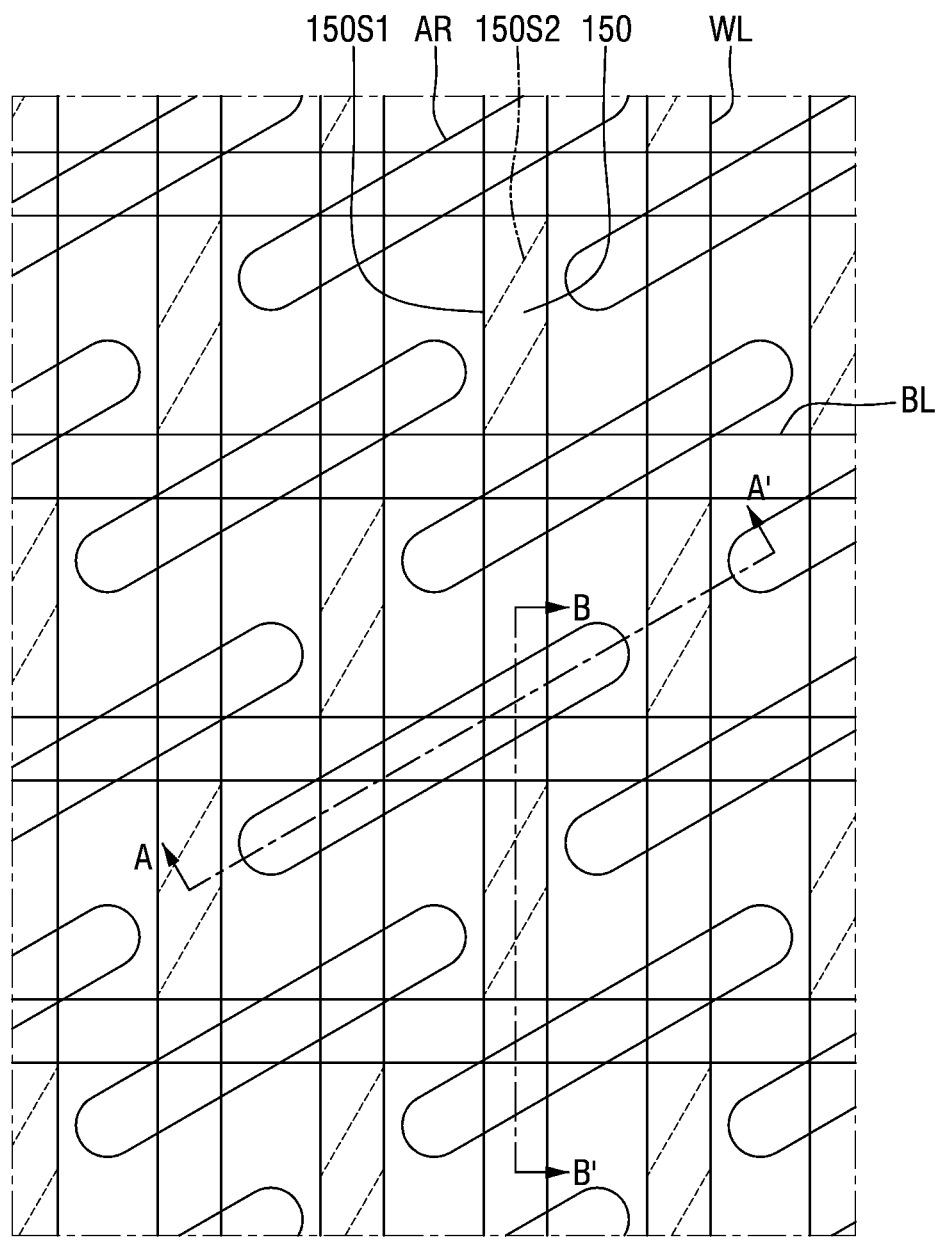
FIG. 1 is a schematic layout diagram for explaining a semiconductor device according to some embodiments of the present inventive concept.
Figure 1:
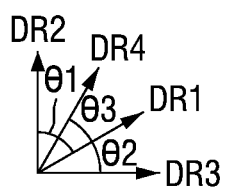
Figure 2:
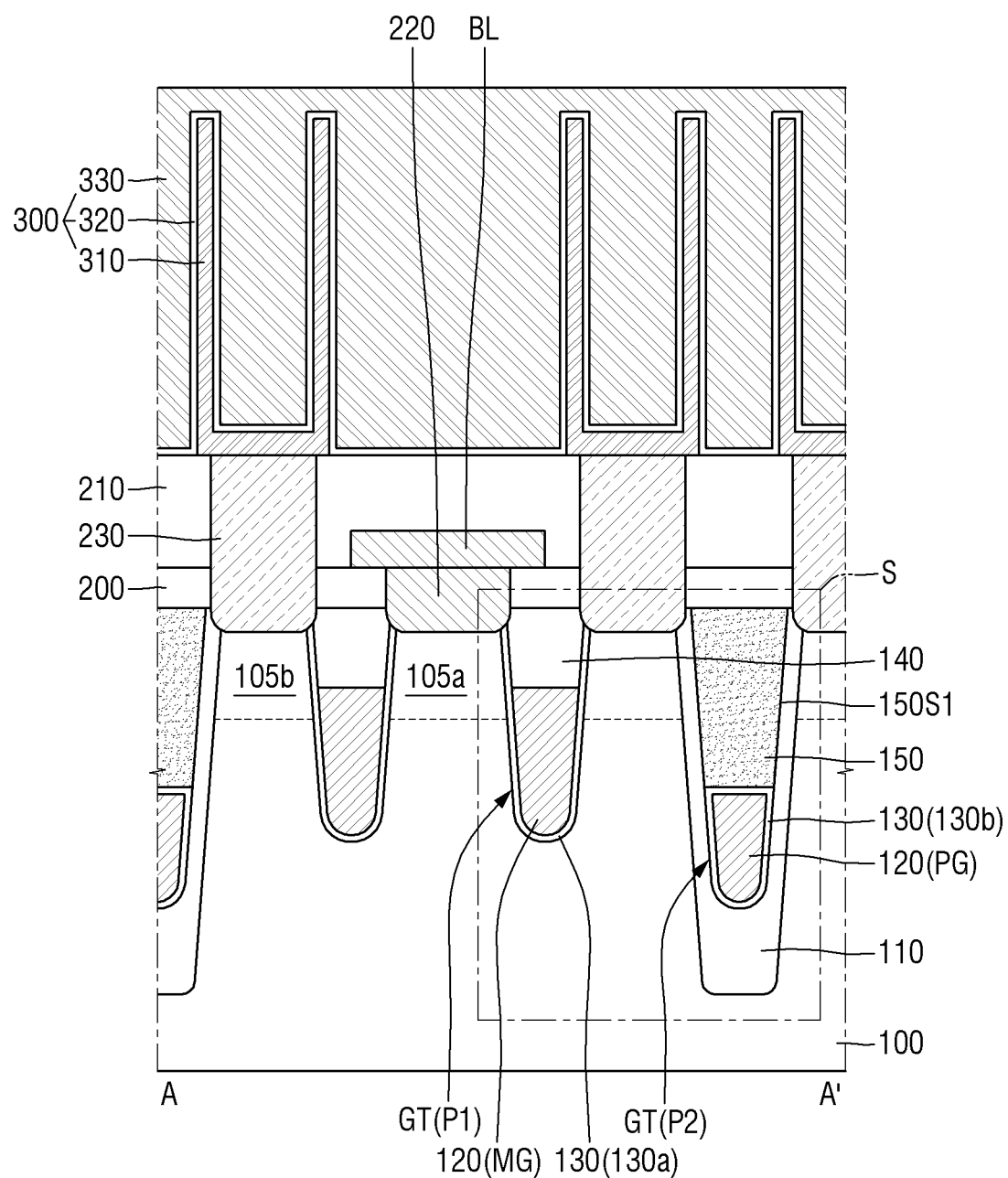
FIG. 2 is a cross-sectional view taken along line A-A of FIG. 1 according to some embodiments of the present inventive concept.
Figure 3:
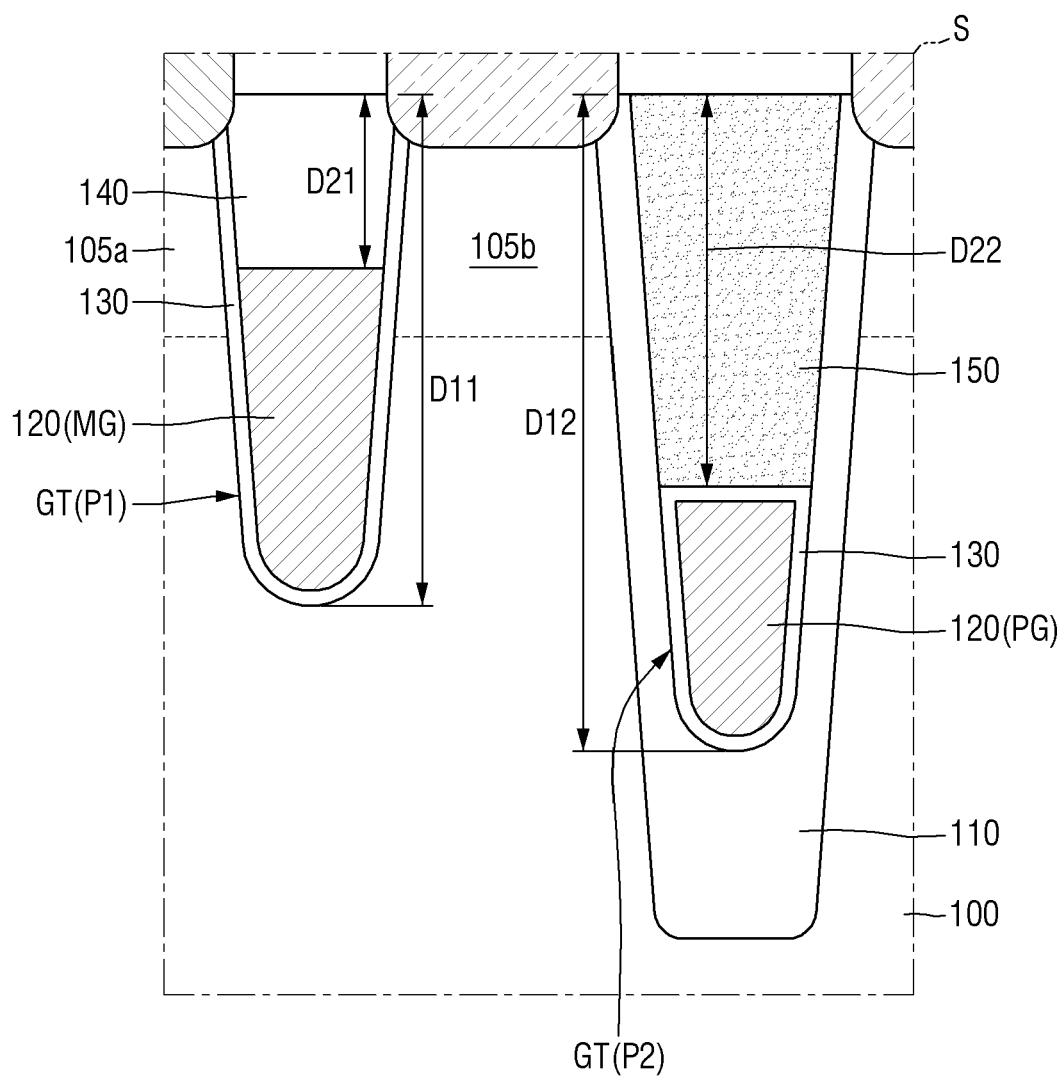
FIG. 3 is an enlarged view of a part S of FIG. 2.
Figure 4:
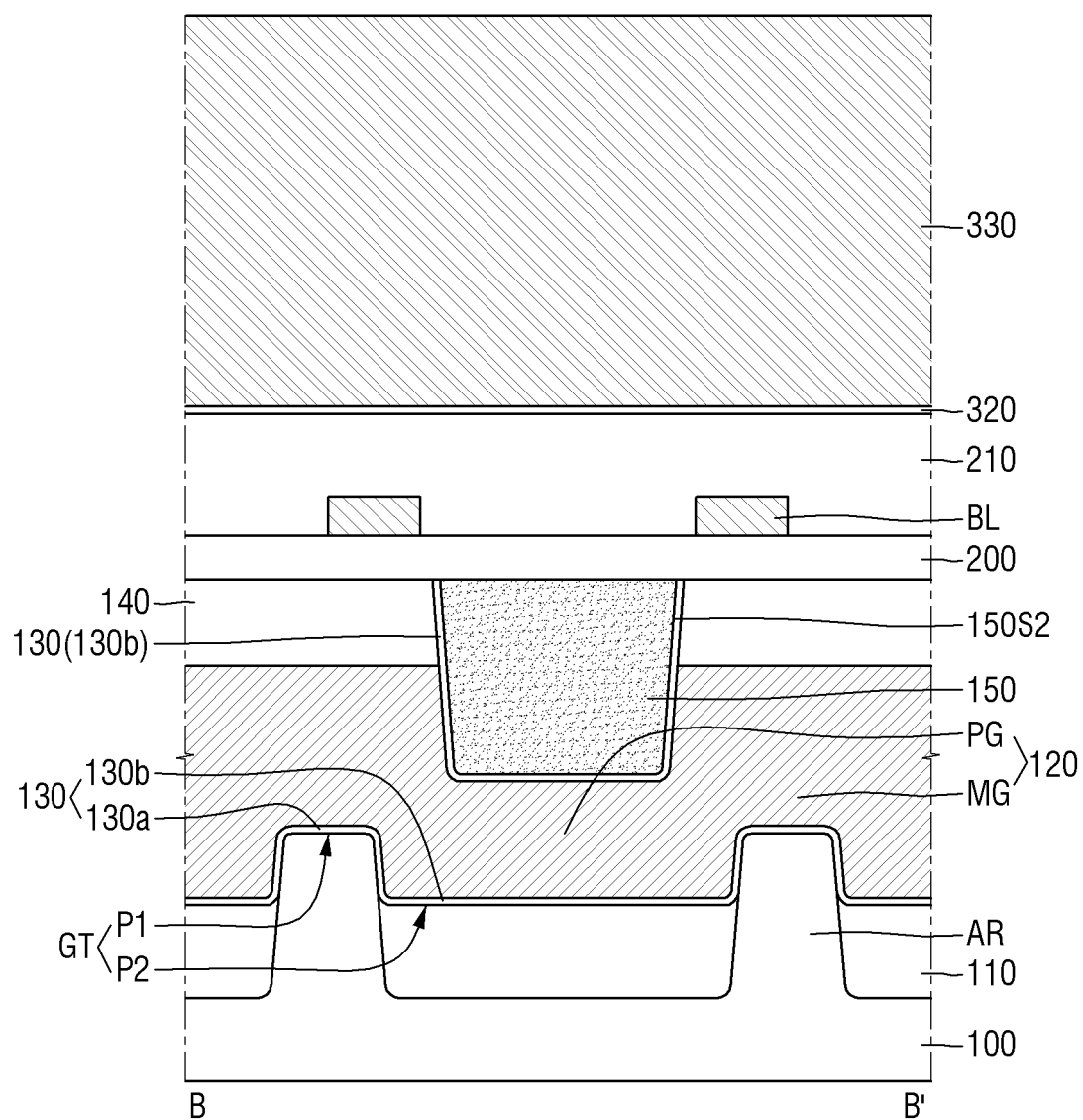
FIG. 4 is a cross-sectional view taken along the line B-B of FIG. 1 according to some embodiments of the present inventive concept.

FIG. 1 is a schematic layout diagram for explaining the semiconductor device according to some embodiments of the present inventive concept. FIG. 2 is a cross-sectional view taken along line A-A of FIG. 1. FIG. 3 is an enlarged view of a part S of FIG. 2. FIG. 4 is a cross-sectional view taken along line B-B of FIG. 1.

Referring to FIGS. 1 to 4, the semiconductor device according to some embodiments of the present inventive concept includes a substrate 100, an isolation film 110, a word line (WL; a gate electrode) 120, a bit line BL, a gate trench GT, a gate insulating film 130, a capping pattern 140, a support structure 150, a first interlayer insulating film 200, a second interlayer insulating film 210, a first contact structure 220, a second contact structure 230 and a capacitor structure 300.

The substrate 100 may have a structure in which a base substrate and an epitaxial layer are stacked, but the present disclosure is not limited thereto. The substrate 100 may be a silicon substrate, a gallium arsenide substrate, a silicon germanium substrate, or an SOI (semiconductor on insulator) substrate. As an example, the substrate 100 will be illustrated below as a silicon substrate. For convenience of explanation, the substrate 100 will be illustrated below as a first conductivity type (e.g., a p type).

The substrate 100 includes an active region AR. The active region AR extends in a first direction DR1 inside the substrate 100. The active region AR is repetitively arranged in the first direction and another direction perpendicular to the first direction. For example, the active regions AR extend in the first direction DR1 inside the substrate 100.

The active regions AR are in the form of a plurality of bars extending parallel to each other. In some embodiments, the center of one active region AR is disposed to be adjacent to a distal end portion of another active region AR.

A word line (WL; gate electrode 120) extends long along a second direction DR2 across the active region AR. The word line WL is repetitively arranged in another direction (e.g., a third direction DR3) perpendicular to the second direction DR2. The word lines WL extend parallel to each other. Also, the word lines WL are spaced apart from each other at equal intervals in the third direction DR3.

A bit line BL intersects the word line WL and extends long along the third direction DR3. The bit lines BL are repetitively arranged in the second direction DR2. The bit lines BL extend parallel to each other. In addition, the bit lines BL are spaced apart from each other at equal intervals in the second direction DR2.

As the design rule of the semiconductor device decreases, as illustrated in FIG. 1, the active region AR may be formed in the form of a diagonal bar. For example, the active region AR may extend in the first direction DR1, and the word line WL may extend in the second direction DR2 which forms a first acute angle θ1 with respect to the first direction DR1. In addition, the bit line BL may extend in the third direction DR3 which forms a second acute angle θ2 with respect to the first direction DR1. In some embodiments, the second direction DR2 and the third direction DR3 may be orthogonal to each other. For example, the sum of the first acute angle θ1 and the second acute angle θ2 may be 90°.

In some embodiments, the first acute angle θ1 may be 60° and the second acute angle θ2 may be 30°. In such a case, the capacitor structure 300 is repetitively disposed in the form of a honeycomb. However, the present disclosure is not limited thereto, and the capacitor structures 300 may be arranged in various forms.

The isolation film 110 is formed in the substrate 100. In addition, the isolation film 110 defines an active region AR in the substrate 100. In FIGS. 2 to 4, the sidewalls of the isolation film 110 are illustrated as having an inclination, but this is merely a feature in the process of forming the isolation film 110, and the technique of the present disclosure is not limited thereto.

The isolation film 110 may include, but is not limited to, for example, at least one of silicon oxide, silicon nitride, silicon oxynitride and combinations thereof. The isolation film 110 may be a single layer made of one kind of insulating material, or may be multi-layers made of a combination of various kinds of insulating materials. For convenience of explanation, the isolation film 110 will be described as containing silicon oxide.

A gate trench GT is formed in the substrate 100. The gate trench GT extends across the active region AR and the isolation film 110. For example, the gate trench GT extends in the second direction DR2. The gate trench GT includes a first trench P1 extending in the second direction DR2 inside the active region AR, and a second trench P2 extending in the second direction DR2 inside the isolation film 110.

In FIGS. 2 and 3, the sidewalls of the gate trench GT are illustrated as having an inclination, but this is only a feature in the process of forming the gate trench GT, and the present disclosure is not limited to thereto.

In some embodiments, the second trench P2 is formed to be deeper than the first trench P1. For example, as illustrated in FIG. 3, a depth D12 of the second trench P2 is deeper than the depth D11 of the first trench P1 with respect to an upper surface of the substrate 100. In an example embodiment, the depth D12 of the second trench P2 is deeper than the depth D11 of the first trench P1 with respect to an upper surface of the active region AR. As a result, a bottom surface of the second trench P2 is lower than a bottom surface of the first trench P1 with reference to the upper surface of the substrate 100.

The gate electrode 120 extends long in the second direction DR2. The gate electrode 120 may function as the word line WL of FIG. 1. The gate electrode 120 is formed in the gate trench GT. For example, the gate electrode 120 fills a part of the gate trench GT (e.g., a lower part of the gate trench GT).

The gate electrode 120 includes a main gate electrode MG that fills a part of the first trench P1, and a pass gate electrode PG that fills a part of the second trench P2. For example, the main gate electrode MG is a part of the gate electrode 120 that intersects the active region AR, and the pass gate electrode PG is a part of the gate electrode 120 that intersects the isolation film 110.

The gate electrode 120 may include a conductive material such as metal. For example, the gate electrode 120 may include at least one of titanium (Ti), tantalum (Ta), tungsten (W), aluminum (Al) and cobalt (Co), and combinations thereof. The present inventive concept is not limited thereto. For example, the gate electrode 120 may include a conductive material other than metal including polysilicon, silicon germanium or the like.

Since the second trench P2 is formed to be deeper than the first trench P1, the bottom surface of the pass gate electrode PG is lower than the bottom surface of the main gate electrode MG with respect to the upper surface of the substrate 100.

In some embodiments, the active region AR includes a first source/drain region 105a and a second source/drain region 105b including impurity of a second conductivity type (e.g., n type) different from the first conductivity type of the active region AR.

The first source/drain region 105a and the second source/drain region 105b are formed on opposite sides of the main gate electrode MG, respectively. For example, as illustrated in FIGS. 1 and 2, the first source/drain region 105a is formed at the center of the active region AR, and the second source/drain region 105b is formed at both distal ends of the active region AR. In some embodiments, the two main gate electrodes overlapping one active region may share one first source/drain region formed at the center of the active region. However, this is only an example, and the present disclosure is not limited thereto.

The gate insulating film 130 is interposed between the substrate 100 and the gate electrode 120. For example, the gate insulating film 130 extends conformally along the sidewalls and the bottom surface of the gate trench GT.

The gate insulating film 130 includes a first gate insulating film 130a in the first trench P1, and a second gate insulating film 130b in the second trench P2. For example, the first gate insulating film 130a is a part of the gate insulating film 130 interposed between the active region AR and the main gate electrode MG, and the second gate insulating film 130b is a part of the gate insulating film 130 interposed between the isolation film 110 and the pass gate electrode PG.

For example, the first gate insulating film 130a extends along the bottom surface and the sidewalls of the main gate electrode MG, and the second gate insulating film 130b extends along the bottom surface and the sidewalls of the pass gate electrode PG.

The gate insulating film 130 may include at least one of silicon oxide, silicon nitride, silicon oxynitride and a high-k material having a dielectric constant higher than silicon oxide. The high-k material may include, for example, but is not limited to, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

The capping pattern 140 is disposed on the main gate electrode MG. The capping pattern 140 fills a part of the first trench P1. For example, the main gate electrode MG fills the lower part of the first trench P1, and the capping pattern 140 fills the upper part of the first trench P1. The capping pattern 140 extends long in the second direction DR2 inside the first trench P1.

The first gate insulating film 130a further extends along the sidewalls of the capping pattern 140. For example, the first gate insulating film 130a extends along the bottom surface and the sidewalls of the main gate electrode MG, and the sidewalls of the capping pattern 140. However, the first gate insulating film 130a is not interposed between the main gate electrode MG and the capping pattern 140. For example, the first gate insulating film 130a does not extend along the upper surface of the main gate electrode MG and the bottom surface of the capping pattern 140.

The capping pattern 140 may include, but is not limited to, at least one of, for example, silicon oxide, silicon nitride, silicon oxynitride, and combinations thereof. For convenience of explanation, the capping pattern 140 will be described below as including silicon nitride.

The support structure 150 is formed on the pass gate electrode PG. The support structure 150 fills a part of the second trench P2. For example, the pass gate electrode PG fills the lower part of the second trench P2, and the support structure 150 fills the upper part of the second trench P2.

The second gate insulating film 130b further extends along the upper surface of the pass gate electrode PG and the bottom surface of the support structure 150. For example, as illustrated in FIGS. 2 and 3, the second gate insulating film 130b extends along the bottom surface, the sidewalls, and the upper surface of the pass gate electrode PG. Thus, the second gate insulating film 130b is interposed between the isolation film 110 and the pass gate electrode PG, and between the support structure 150 and the pass gate electrode PG.

The support structure 150 includes a first sidewall 150S1, and a second sidewall 150S2 intersecting the first sidewall 150S1. The first sidewall 150S1 and the second sidewall 150S2 of the support structure 150 may be connected to each other to form the sidewalls of the support structure 150. For example, the support structure 150 includes two first sidewalls 150S1 facing each other, and two second sidewalls 150S2 facing each other between the two first sidewalls 150S1.

The first sidewall 150S1 of the support structure 150 extends in the second direction DR2. For example, as illustrated in FIGS. 1 to 3, the first sidewall 150S1 of the support structure 150 is defined by the sidewall of the second trench P2. For example, the first sidewall 150S1 of the support structure 150 is in contact with the inner wall of the isolation film 110. The word "contact" or the phrase "in contact with" refers to a direct connection i.e. touching.

The second sidewall 150S2 of the support structure 150 extends in a fourth direction DR4 intersecting the second direction DR2. For example, as illustrated in FIGS. 1 and 4, the second sidewall 150S2 of the support structure 150 faces the sidewall of the capping pattern 140 that intersects the second direction DR2.

The second gate insulating film 130b further extends along the second sidewall 150S2 of the support structure 150. For example, as illustrated in FIGS. 2 to 4, the second gate insulating film 130b further extends along the bottom surface and the sidewall of the pass gate electrode PG, and the bottom surface and the second sidewall 150S2 of the support structure 150. Thus, the second gate insulating film 130b is interposed between the second sidewall 150S2 of the support structure 150 and the capping pattern 140.

However, the second gate insulating film 130b is not interposed between the isolation film 110 and the support structure 150. For example, the second gate insulation film 130b does not extend along the first sidewall 150S1 of the support structure 150.

In some embodiments, the upper surface of the support structure 150 is disposed on the same plane as the upper surface of the capping pattern 140. For example, the upper surface of the support structure 150 and the upper surface of the capping pattern 140 may all be disposed on the same plane as the upper surface of the substrate 100.

In some embodiments, the support structure 150 is formed to be deeper than the capping pattern 140. For example, as illustrated in FIG. 3, a depth D22 of the support structure 150 is deeper than the depth D21 of the capping pattern 140 with respect to the upper surface of the substrate 100. As a result, the bottom surface of the support structure 150 is lower than the bottom surface of the capping pattern 140 with respect to the upper surface of the substrate 100. Further, the upper surface of the pass gate electrode PG is lower than the upper surface of the main gate electrode MG with respect to the upper surface of the substrate 100.

In some embodiments, the second sidewall 150S2 of the support structure 150 extends in a direction different from the first direction DR1. For example, as illustrated in FIG. 1, the second sidewall 150S2 of the support structure 150 extends in the fourth direction DR4 which forms a third acute angle θ3 with respect to the first direction DR1.

In some embodiments, the third acute angle θ3 is smaller than the first acute angle θ1. For example, the third acute angle θ3 may be 30° and the first acute angle θ1 may be 60°. Further, as illustrated in FIG. 1, the extent to which the second sidewall 150S2 of the support structure 150 is tilted with respect to the word line WL is smaller than the extent to which the active region AR is tilted with respect to the word line WL. Conversely, the extent to which the second sidewall 150S2 of the support structure 150 is tilted with respect to the bit line BL is larger than the extent to which the active region AR is tilted with respect to the bit line BL.

The support structure 150 may include, but is not limited to, at least one of, for example, silicon oxide, silicon nitride, silicon oxynitride, and combinations thereof. For convenience of explanation, the support structure 150 will be described below as including silicon nitride.

In some embodiments, the support structure 150 may include a material different from a material of the isolation film 110. For example, the isolation film 110 may include silicon oxide and the support structure 150 may include silicon nitride.

In some embodiments, the support structure 150 may include a material different from that of the capping pattern 140. For example, the capping pattern 140 and the support structure 150 may include silicon nitride having material compositions different from each other. In some embodiments, the support structure 150 may include a material having a dielectric constant lower than that of the capping pattern 140. Therefore, the support structure 150 may have a dielectric constant lower than that of the capping pattern 140. In such a case, the support structure 150 may further reduce a gate induced drain leakage (GIDL) due to the pass gate electrode PG to be described later to provide a semiconductor device with improved performance.

The first interlayer insulating film 200 and the second interlayer insulating film 210 are stacked in order on the substrate 100. Although only two interlayer insulating films of the first interlayer insulating film 200 and the second interlayer insulating film 210 are described as being formed on the substrate 100, this is only an example, and the present disclosure is not limited thereto. For example, three or more interlayer insulating films may, of course, be formed on the substrate 100.

The first interlayer insulating film 200 and the second interlayer insulating film 210 may include, for example, but are not limited to, at least one of silicon oxide, silicon nitride, and silicon oxynitride.

The first contact structure 220 is connected to a first source/drain region 105a. For example, the first contact structure 220 penetrates the first interlayer insulating film 200 and is connected to the first source/drain region 105a.

The second contact structure 230 is connected to a second source/drain region 105b. For example, the second contact structure 230 penetrates the first interlayer insulating film 200 and the second interlayer insulating film 210, and is connected to the second source/drain region 105b.

The first contact structure 220 and the second contact structure 230 may include a conductive material such as metal. For example, the first contact structure 220 and the second contact structure 230 may include, for example, at least one of titanium (Ti), tantalum (Ta), tungsten (W), aluminum (Al) and cobalt (Co), and combinations thereof. The present inventive concept is not limited thereto. For example, the first contact structure 220 and the second contact structure 230 may be made of a conductive material other than metal such as polysilicon, silicon germanium or the like.

Each of the first contact structure 220 and the second contact structure 230 may be a single layer made of one type of conductive material or may be multi-layers made of combinations of various kinds of conductive materials. For example, the second contact structure 230 may be multi-layers including a polysilicon layer and a metal layer sequentially stacked on the second source/drain region 105b.

A part of the bit line BL is connected to the first contact structure 220. For example, the bit line BL is formed on the upper surface of the first interlayer insulating film 200 and the upper surface of the first contact structure 220. Therefore, the bit line BL may be electrically connected to the first source/drain region 105a. The bit line BL may be a single layer made of one type of conductive material, or may be multi-layers made of combinations of different types of conductive materials.

A part of the capacitor structure 300 is connected to the second contact structure 230. For example, the capacitor structure 300 is formed on the upper surface of the second interlayer insulating film 210 and the upper surface of the second contact structure 230. As a result, the capacitor structure 300 may be electrically connected to the second source/drain region 105b.

The capacitor structure 300 may store charges in a semiconductor device (e.g., a semiconductor memory device) according to some embodiments. For example, the capacitor structure 300 includes a lower electrode 310, a capacitor dielectric film 320 and an upper electrode 330. The capacitor structure 300 may store the charges in the capacitor dielectric film 320, using a potential difference generated between the lower electrode 310 and the upper electrode 330.

The lower electrode 310 and the upper electrode 330 may include, for example, but are not limited to, doped polysilicon, metal or metal nitride. The capacitor dielectric film 320 may include, but is not limited to, for example, silicon oxide or a high-k material.

When the source/drain region and the gate electrode are disposed adjacent to each other, a strong electric field may be generated between them. As a result, direct tunneling between the source/drain region and the gate electrode may be generated, and the leakage current caused by this may be referred to as a gate induced drain leakage (GIDL).

With higher integration of semiconductor devices, the gate induced drain leakage may be generated not only by the main gate electrode but also by the pass gate electrode. However, in the semiconductor device according to some embodiments, the gate induced drain leakage may be prevented by disposing the pass gate electrode PG to be lower than the main gate electrode MG. The pass gate electrode PG is disposed to be lower than the second source/drain region 105*b*, and thus the pass gate electrode PG is not present in the second source/drain region 105*b*. The gate induced drain leakage depends on an overlap area of the source/drain region and the gate electrode, and the pass gate electrode PG disposed to be lower than the main gate electrode MG does not have the overlap area.

Further, the semiconductor device according to some embodiments includes a support structure 150 formed on the pass gate electrode PG. The support structure 150 may support the second trench P2 in which the pass gate electrode PG is buried. For example, the support structure 150 may prevent the second trench P2 from being bent even when an aspect ratio of the second trench P2 is large. Therefore, a semiconductor device with improved reliability and performance can be provided.

Figure 5:
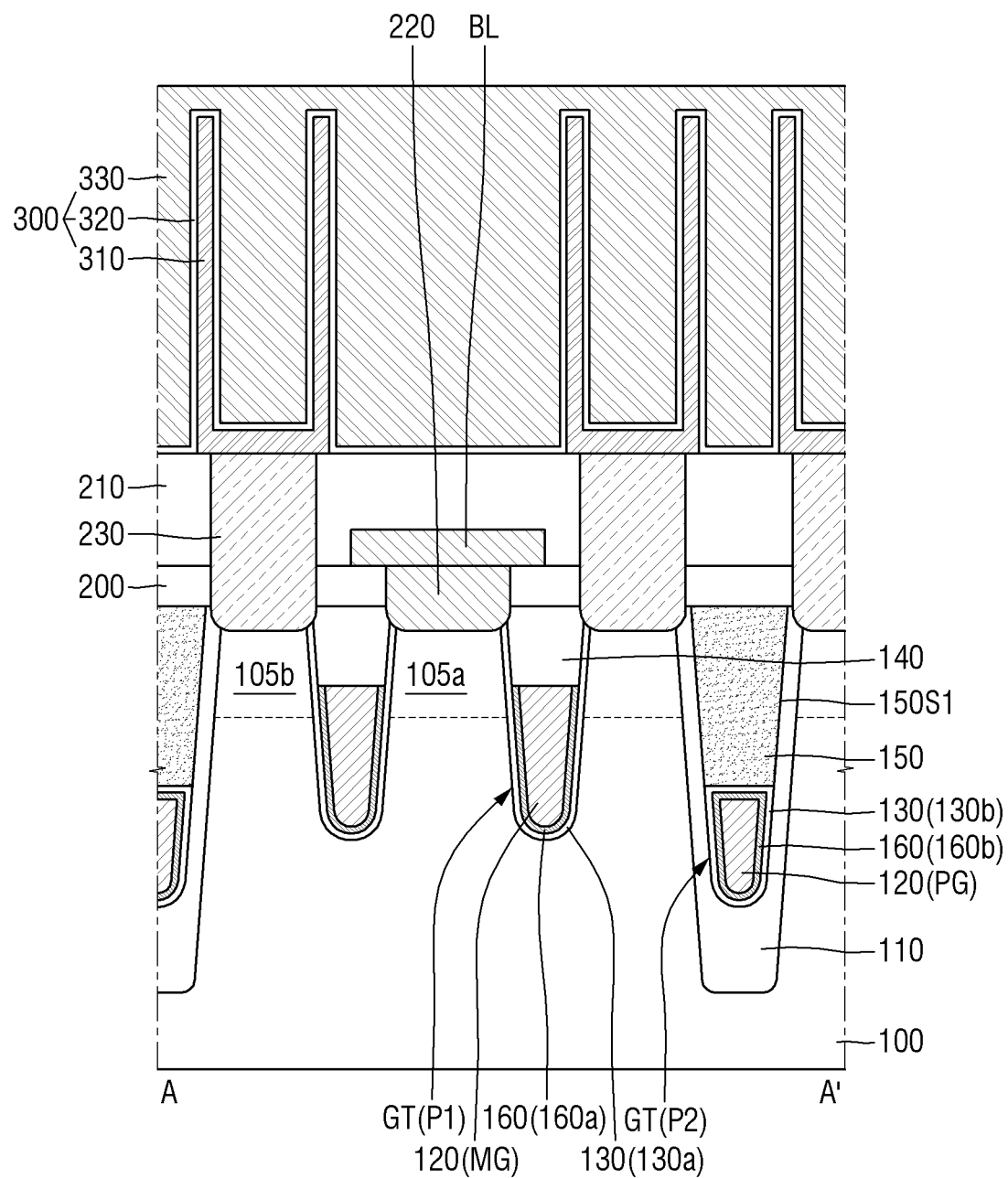
FIGS. 5 and 6 are cross-sectional views for explaining a semiconductor device according to some embodiments of the present inventive concept.
Figure 6:
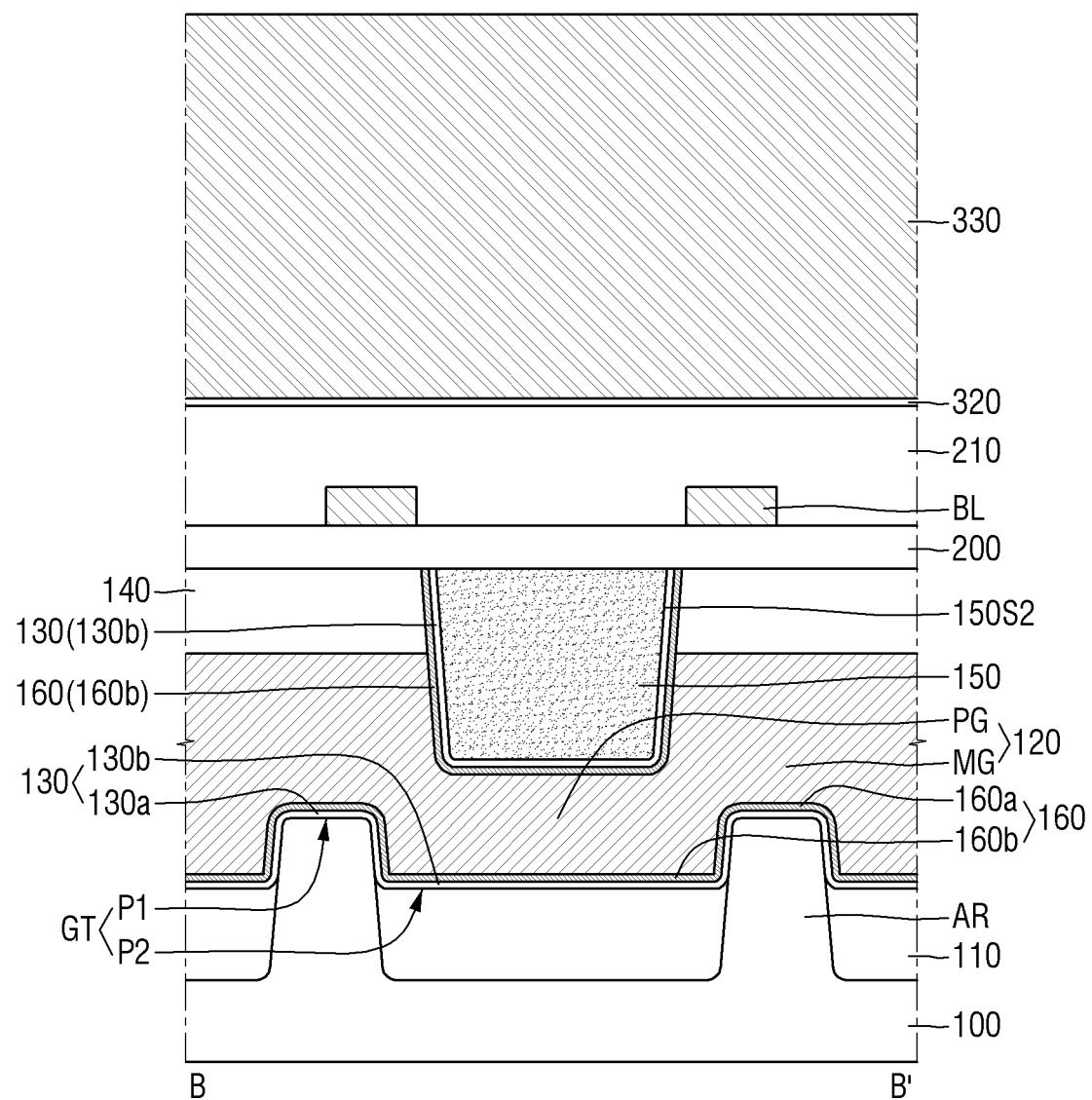

FIGS. 5 and 6 are cross-sectional views for explaining a semiconductor device according to some embodiments of the present inventive concept. For reference, FIG. 5 is a cross-sectional view taken along line A-A of FIG. 1. FIG. 6 is a cross-sectional view taken along line B-B of FIG. 1. For the sake of convenience of explanation, repeated parts of those described using FIGS. 1 to 4 will be briefly described or omitted.

Referring to FIGS. 1, 5, and 6, the semiconductor device according to some embodiments further includes a barrier film 160.

The barrier film 160 is interposed between the gate insulating film 130 and the gate electrode 120. For example, the barrier film 160 is conformally extends along the surface of the gate insulating film 130.

The barrier film 160 includes a first barrier film 160*a* in the first trench P1, and a second barrier film 160*b* in the second trench P2. For example, the first barrier film 160*a* is a part of the barrier film 160 interposed between the first gate insulating film 130*a* and the main gate electrode MG, and the second barrier film 160*b* is a part of the barrier film 160 interposed between the second gate insulating film 130*b* and the pass gate electrode PG.

For example, the first barrier film 160*a* extends along the bottom surface and the sidewall of the main gate electrode MG, and the second barrier film 160*b* extends along the bottom surface, the upper surface and the sidewall of the pass gate electrode PG.

In some embodiments, the first barrier film 160*a* does not extend along the sidewall of the capping pattern 140 extending in the second direction DR2. For example, as illustrated in FIG. 5, the capping pattern 140 is formed on the upper surface of the first barrier film 160*a* and the upper surface of the main gate electrode MG. Also, the first barrier film 160*a* is not interposed between the main gate electrode MG and the capping pattern 140. For example, the first barrier film 160*a* does not extend along the upper surface of the main gate electrode MG and the bottom surface of the capping pattern 140. For example, the capping pattern 140 is in contact with the upper surface of the gate electrode MG.

In some embodiments, the second barrier film 160*b* further extends along the upper surface of the pass gate electrode PG and the bottom surface of the support structure 150. For example, the second barrier film 160*b* extends along the bottom surface, the sidewalls, and the upper surface of the pass gate electrode PG. Thus, the second barrier film 160*b* is interposed between the isolation film 110 and the pass gate electrode PG, and between the support structure 150 and the pass gate electrode PG.

In some implementations, the second barrier film 160*b* further extends along the second sidewall 150S2 of the support structure 150. For example, as illustrated in FIG. 6, the second barrier film 160*b* is formed along the bottom surface, the upper surface and the sidewalls of the pass gate electrode PG, and the bottom surface and the second sidewall 150S2 of the support structure 150.

The barrier film 160 may include, for example, metal nitride. For example, the barrier film 160 may include, but is not limited to, at least one of titanium nitride (TiN), tungsten nitride (WN) and combinations thereof.

In some embodiments, the barrier film 160 may include impurity-doped metal nitride. For example, the metal nitride of the barrier film 160 may be doped with an impurity that may change the work function. For example, when the first source/drain region 105*a* and the second source/drain region 105*b* have the second conductivity type (e.g., n type), the barrier film 160 may be doped with lanthanum (La).

Figure 7:
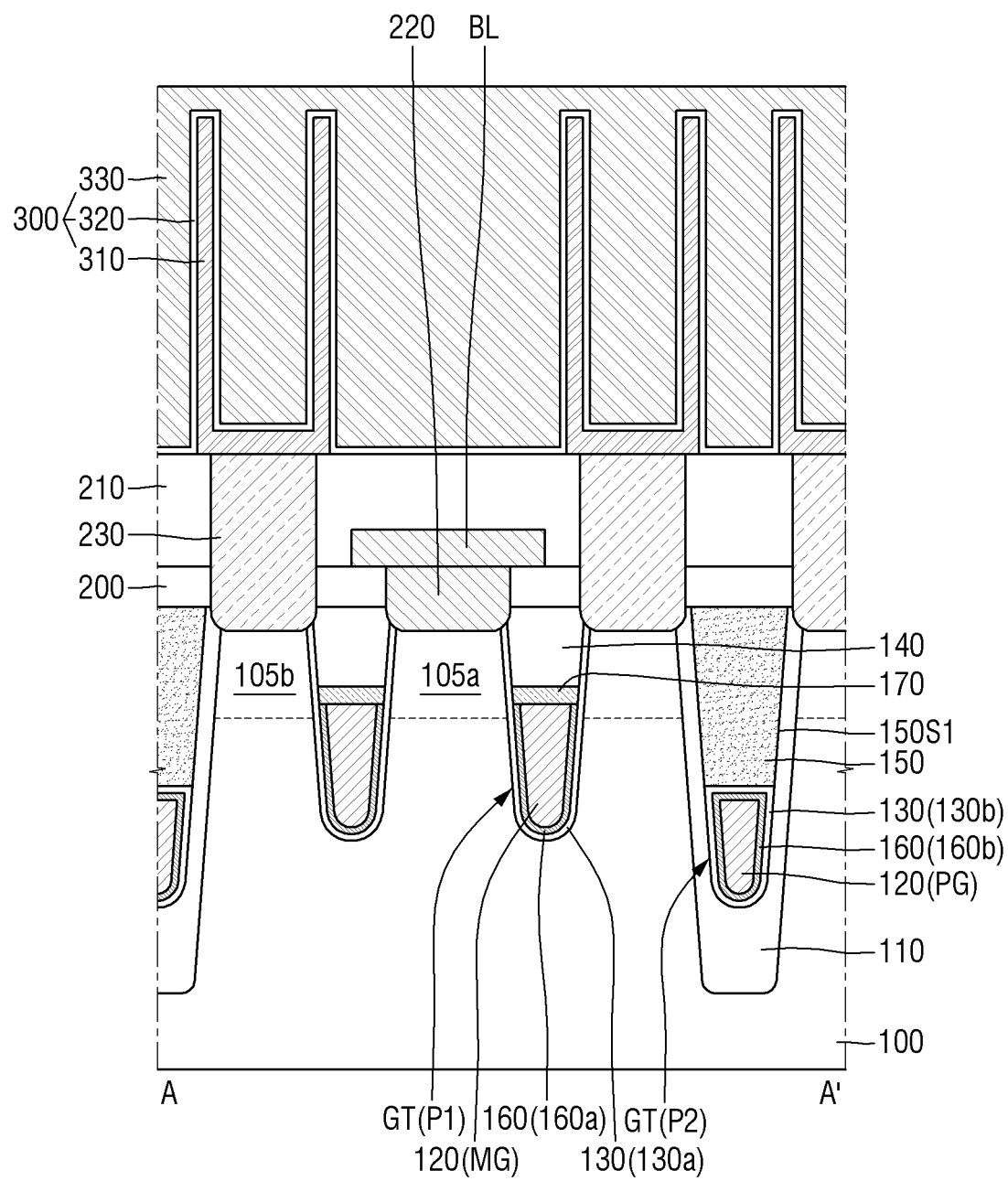
FIGS. 7 and 8 are cross-sectional views for explaining a semiconductor device according to some embodiments of the present inventive concept.
Figure 8:
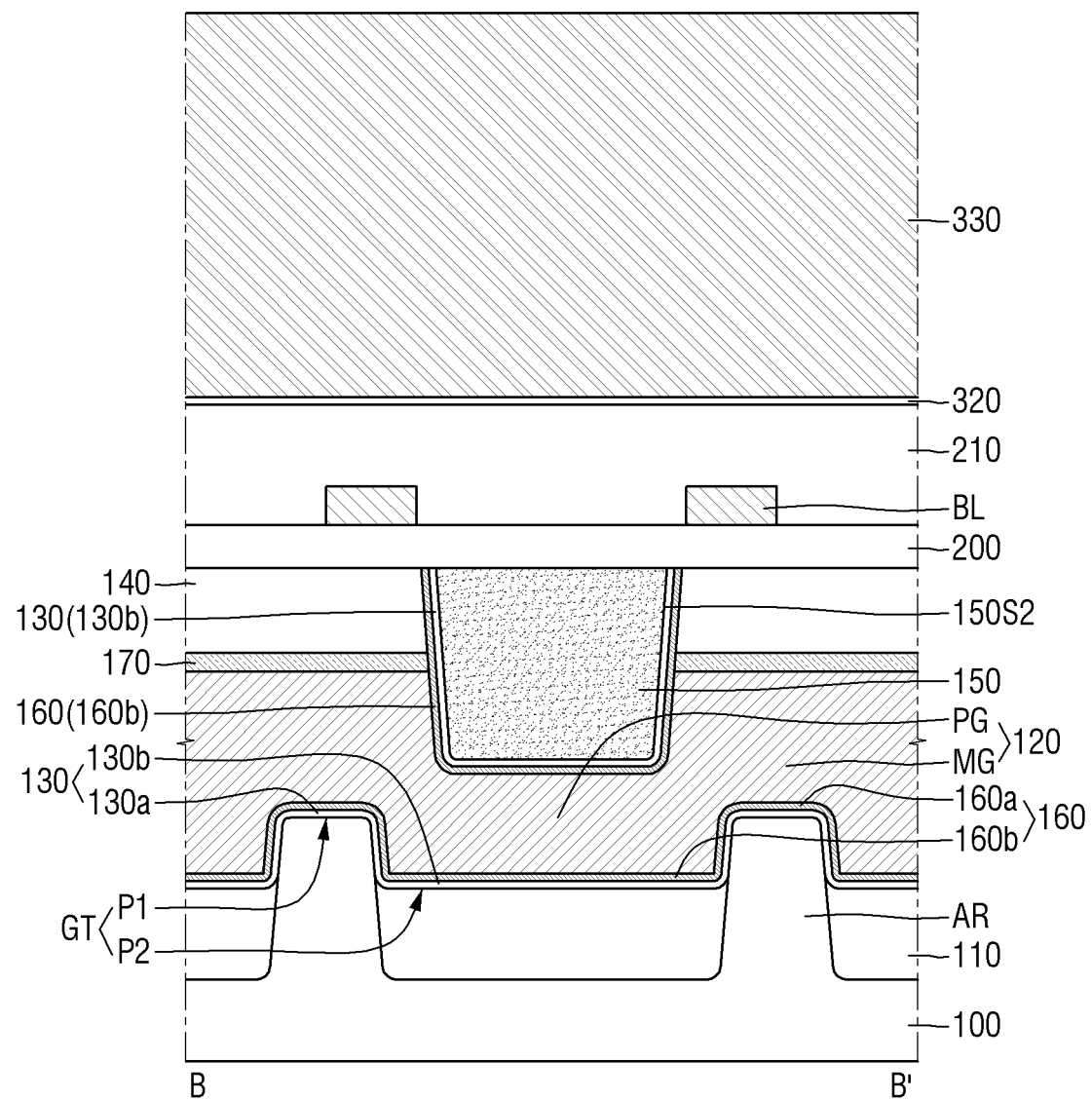

FIGS. 7 and 8 are cross-sectional views for explaining a semiconductor device according to some embodiments of the present inventive concept. For reference, FIG. 7 is a cross-sectional view taken along line A-A of FIG. 1. FIG. 8 is a cross-sectional view taken along line B-B of FIG. 1. For the sake of convenience of explanation, repeated parts of those described using FIGS. 1 to 6 will be briefly described or omitted.

Referring to FIGS. 1, 7, and 8, the semiconductor device according to some embodiments further includes an inserting conductive film 170.

The inserting conductive film 170 is interposed between the main gate electrode MG and the capping pattern 140. For example, the inserting conductive film 170 conformally extends along the upper surface of the main gate electrode MG.

In some embodiments, the inserting conductive film 170 does not extend along the sidewalls of the capping pattern 140 extending in the second direction DR2. For example, as illustrated in FIG. 7, the capping pattern 140 is formed on the upper surface of the first barrier film 160*a* and the upper surface of the main gate electrode MG. For example, the capping pattern 140 is in contact with the upper surface of the first barrier film 160*a* and the upper surface of the main gate electrode MG.

In some embodiments, the inserting conductive film 170 does not extend along the upper surface of the pass gate electrode PG. Also, the bottom surface of the inserting conductive film 170 is higher than the bottom surface of the support structure 150 with respect to a bottom surface of the isolation film 110.

In some embodiments, the inserting conductive film 170 may include a material different from a material of the gate electrode 120. For example, the gate electrode 120 may include tungsten (W), and the inserting conductive film 170 may include polysilicon, but the embodiment is not limited thereto.

Figure 9:
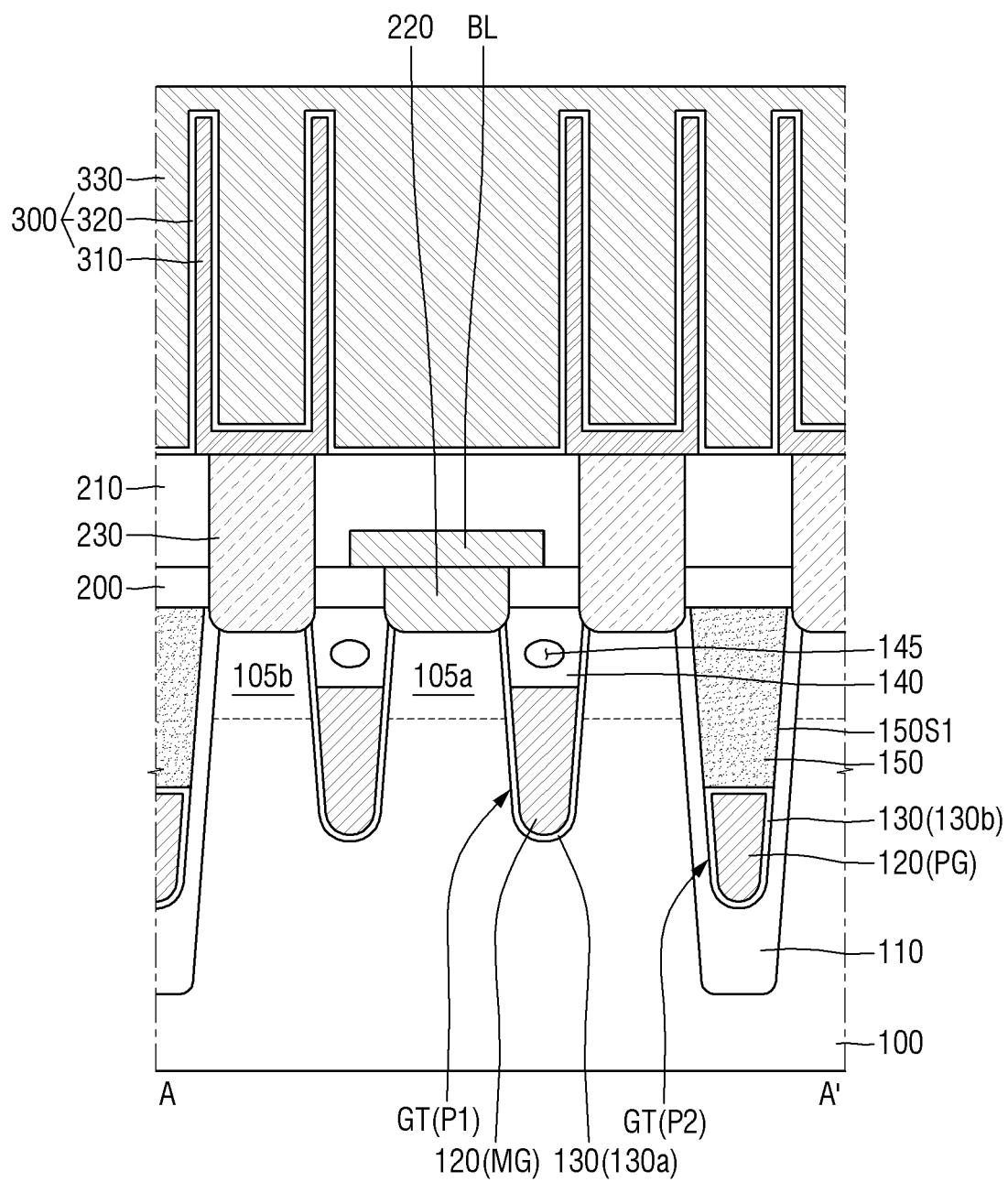
FIGS. 9 and 10 are cross-sectional views for explaining a semiconductor device according to some embodiments of the present inventive concept.
Figure 10:
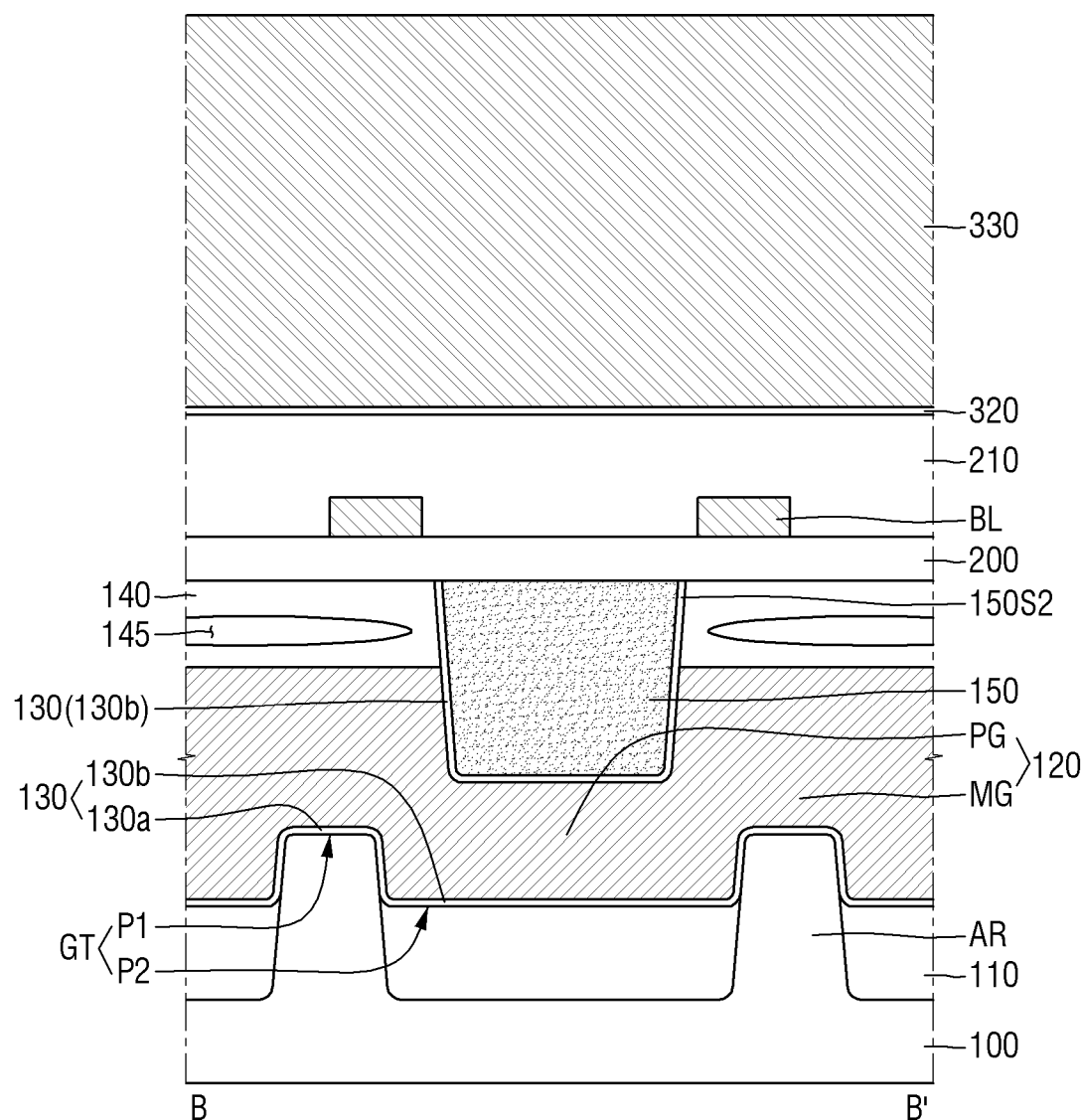

FIGS. 9 and 10 are cross-sectional views for explaining a semiconductor device according to some embodiments of the present inventive concept. For reference, FIG. 9 is a cross-sectional view taken along line A-A of FIG. 1. FIG. 10 is a cross-sectional view taken along line B-B of FIG. 1. For the sake of convenience of explanation, repeated parts of those described using FIGS. 1 to 4 will be briefly described or omitted.

Referring to FIGS. 1, 9, and 10, in the semiconductor device according to some embodiments, the capping pattern 140 includes an air gap 145 (or a void).

The air gap 145 is illustrated as having an elliptical shape and extending long in the second direction DR2, but this is only an example, and the air gap 145 may have various shapes depending on the formation process thereof. For example, a spherical air gap may be formed in the capping pattern 140.

Since the air gap 145 in the capping pattern 140 has a low dielectric constant, it is possible to reduce the parasitic capacitance of the semiconductor device according to some embodiments.

Figure 11:
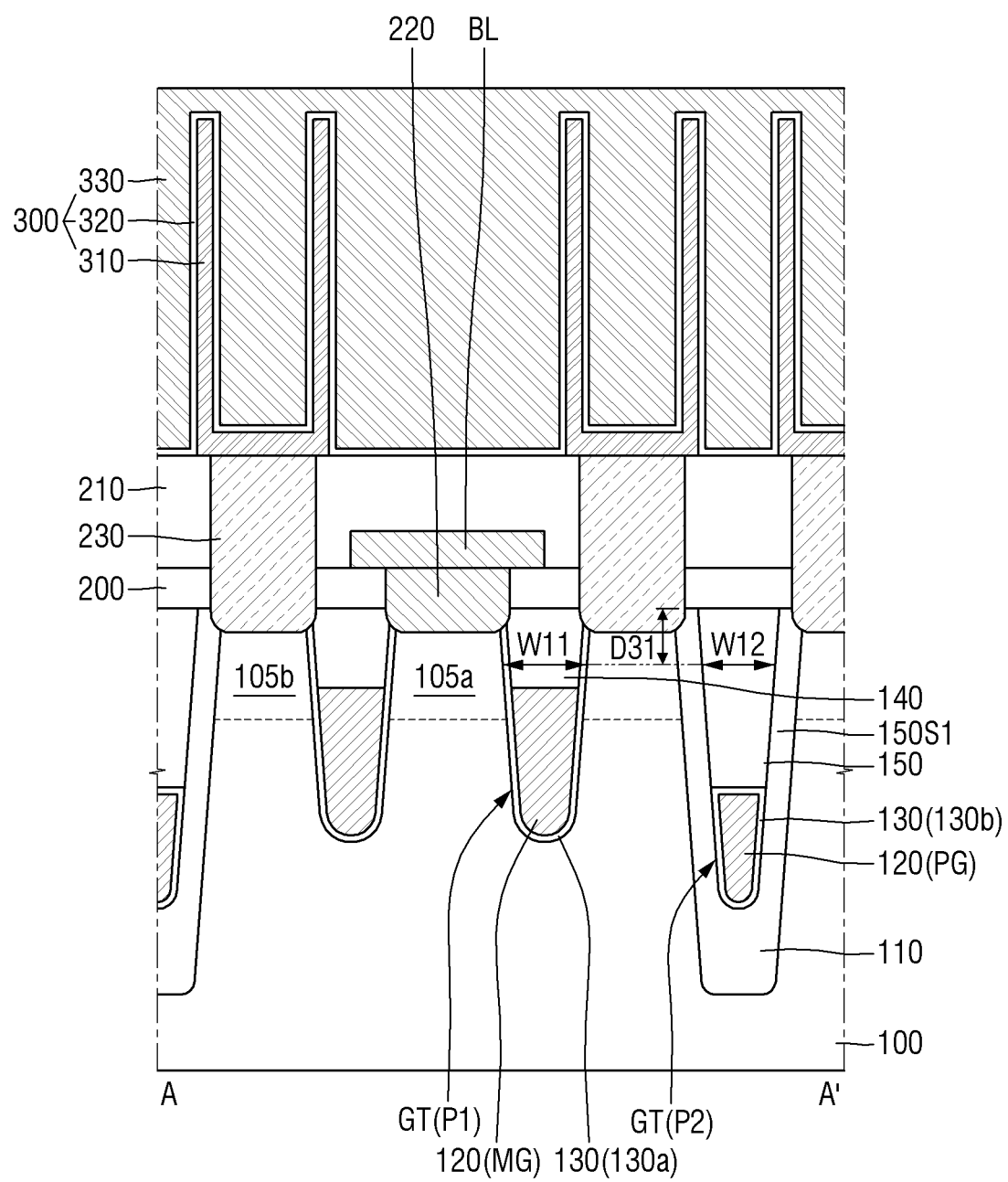
FIG. 11 is a cross-sectional view illustrating a semiconductor device according to some embodiments of the present inventive concept.

FIG. 11 is a cross-sectional view illustrating a semiconductor device according to some embodiments of the present inventive concept. For reference, FIG. 11 is a cross-sectional view taken along line A-A of FIG. 1. For the sake of convenience of explanation, repeated parts of those described using FIGS. 1 to 4 will be briefly described or omitted.

Referring to FIGS. 1 and 11, in the semiconductor device according to some embodiments, a width of the second trench P2 is smaller than a width of the first trench P1.

Here, the widths mean widths in the first direction DR1 at the same level or depth in the first trench P1 and the second trench P2. For example, an arbitrary first depth D31 may be defined with respect to the upper surface of the substrate 100. At this time, a width W12 of the second trench P2 in the first direction DR1 at the first depth D31 is smaller than a width W11 of the first trench P1 in the first direction DR1 at the first depth D31.

Therefore, the semiconductor device according to some embodiments may further reduce the gate induced drain leak (GIDL) caused by the pass gate electrode PG to provide a semiconductor device with improved performance.

Figure 12:
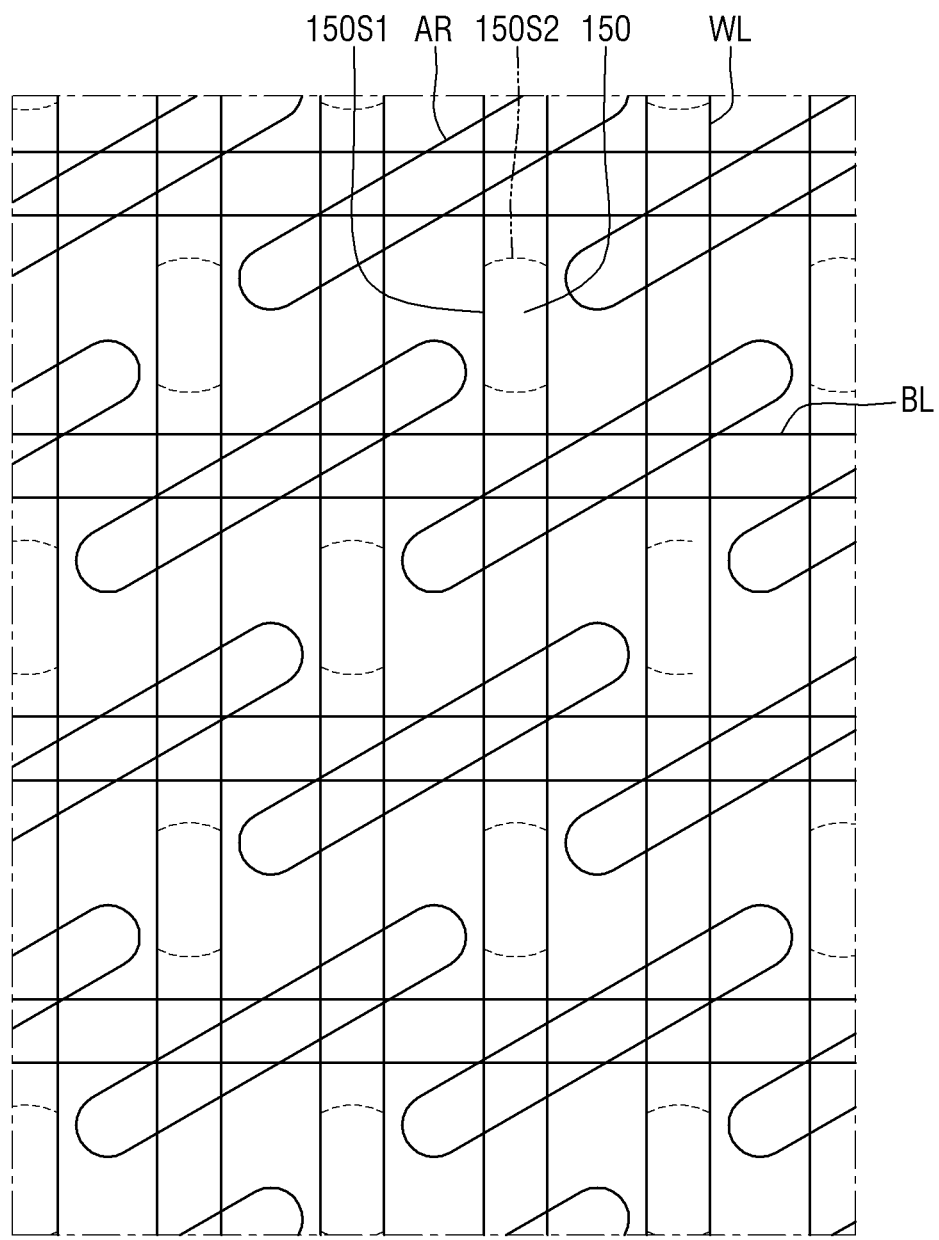
FIG. 12 is a schematic layout diagram for explaining a semiconductor device according to some embodiments of the present inventive concept.

FIG. 12 is a schematic layout diagram for explaining a semiconductor device according to some embodiments of the present inventive concept. For the sake of convenience of explanation, repeated parts of those described using FIGS. 1 to 4 will be briefly described or omitted.

Referring to FIG. 12, in the semiconductor device according to some embodiments, the second sidewall 150S2 of the support structure 150 has a circular arc shape.

For example, the support structure 150 includes two second sidewalls 150S2 facing each other. The two second sidewalls 150S2 constitute a part of a circle defined around the central part of the support structure 150.

However, in some embodiments, the first sidewall 150S1 of the support structure 150 extends in the second direction DR2.

Figure 13:
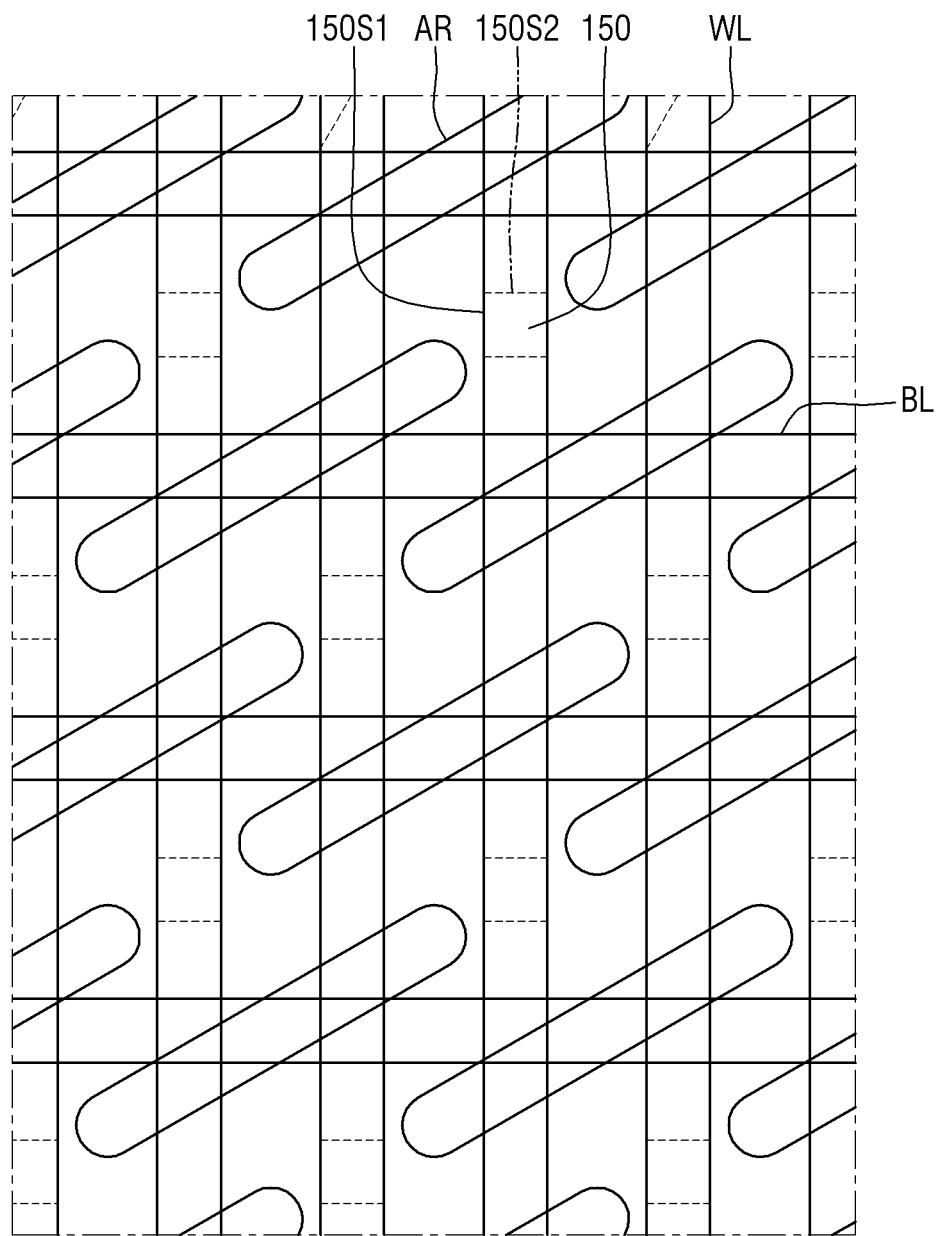
FIG. 13 is a schematic layout diagram for explaining a semiconductor device according to some embodiments of the present inventive concept.

FIG. 13 is a schematic layout diagram for explaining a semiconductor device according to some embodiments of the present inventive concept. For the sake of convenience of explanation, repeated parts of those described using FIGS. 1 to 4 will be briefly described or omitted.

Referring to FIG. 13, in the semiconductor device according to some embodiments, the second sidewall 150S2 of the support structure 150 extends along the third direction DR3.

For example, the second sidewall 150S2 of the support structure 150 extends alongside the bit line BL.

In some embodiments, the second direction DR2 and the third direction DR3 may be orthogonal to each other. For example, the sum of the first acute angle $\theta 1$ and the second acute angle $\theta 2$ may be 90°. Therefore, the first sidewall 150S1 and the second sidewall 150S2 of the support structure 150 may be orthogonal to each other.

Figure 14:
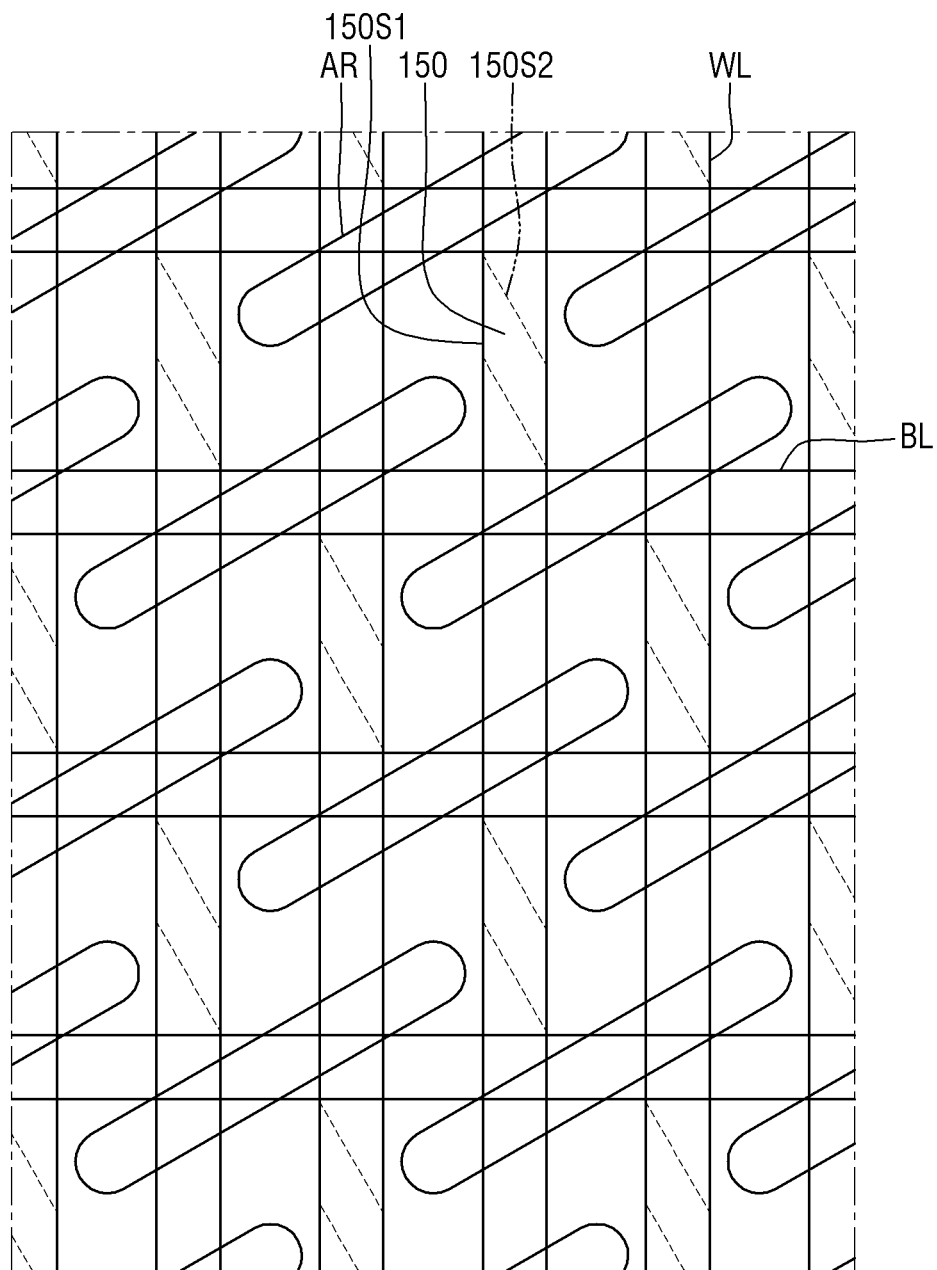
FIG. 14 is a schematic layout diagram for explaining a semiconductor device according to some embodiments of the present inventive concept.

FIG. 14 is a schematic layout diagram for explaining a semiconductor device according to some embodiments of the present inventive concept. For the sake of convenience of explanation, repeated parts of those described using FIGS. 1 to 4 will be briefly described or omitted.

Referring to FIG. 14, in the semiconductor device according to some embodiments, the second sidewall 150S2 of the support structure 150 extends in a fifth direction DR5 which forms a first angle $\theta 4$ with the first direction DR1.

In some embodiments, the first angle $\theta 4$ is greater than the first acute angle $\theta 1$ with respect to the first direction DR1. For example, the first acute angle $\theta 1$ may be 60° and the first angle $\theta 4$ may be 90°. However, this is only an example, and the present disclosure is not limited thereto.

Hereinafter, the semiconductor device according to some embodiments of the present inventive concept will be described with reference to FIGS. 1 to 14.

FIGS. 15 to 39 are intermediate step diagrams for explaining a method for fabricating a semiconductor device according to some embodiments of the present inventive concept. For the sake of convenience of explanation, repeated parts of those described using FIGS. 1 to 11 will be briefly described or omitted.

Figure 15:
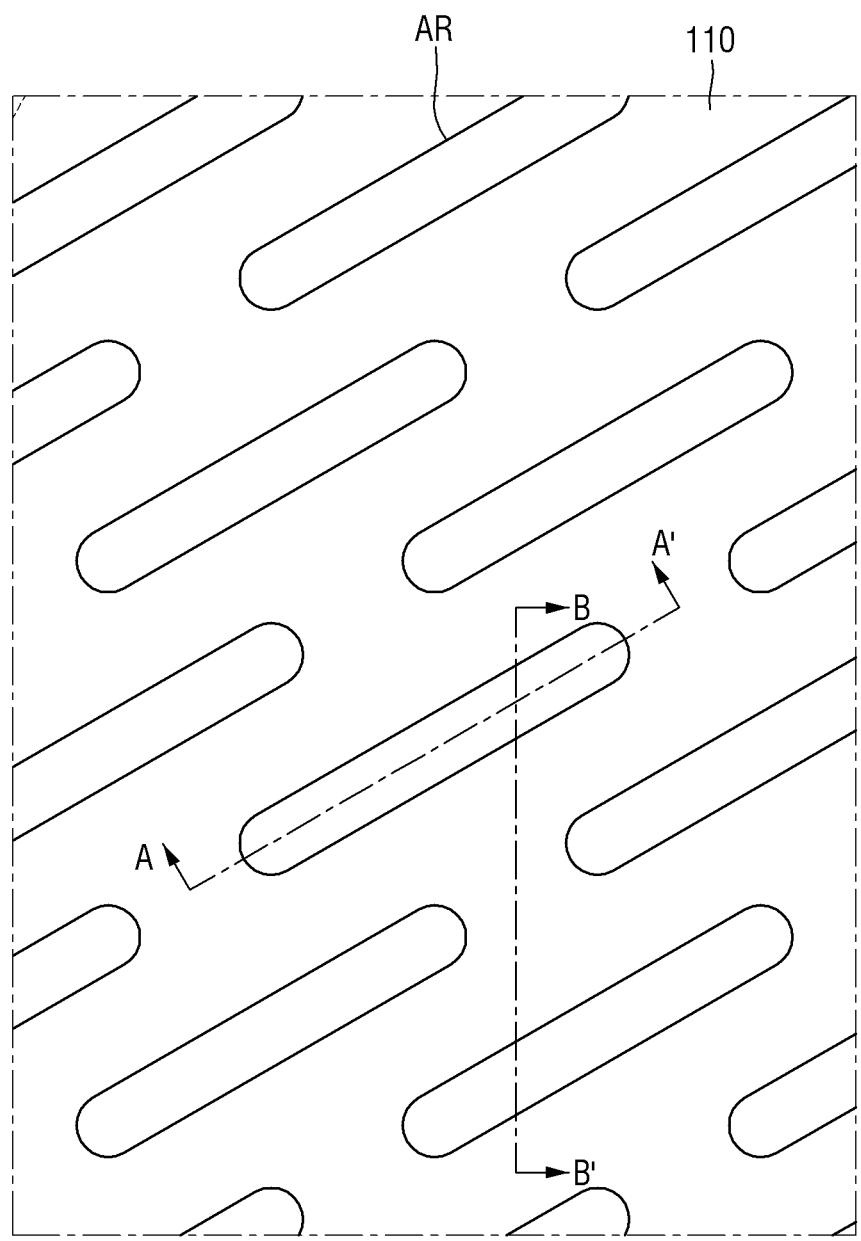
FIGS. 15 to 39 are intermediate step diagrams for explaining a method for fabricating a semiconductor device according to some embodiments of the present inventive concept.
Figure 16:
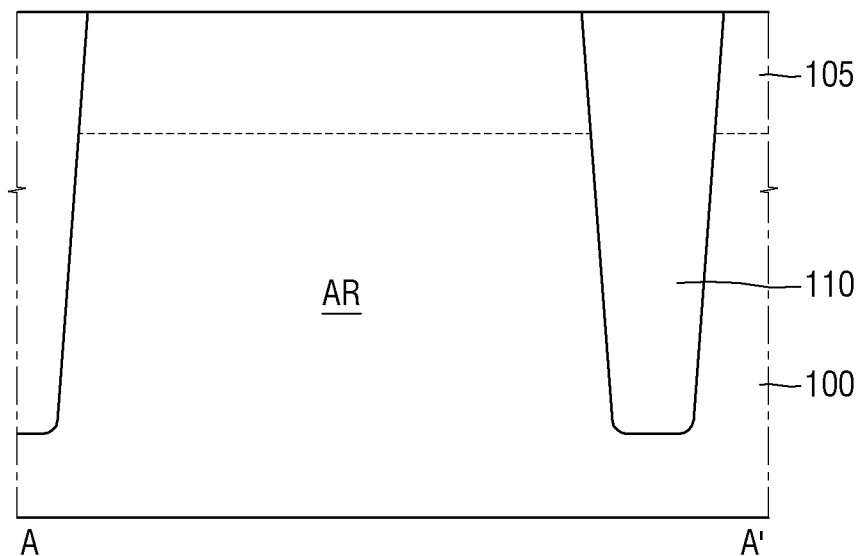
Figure 17:
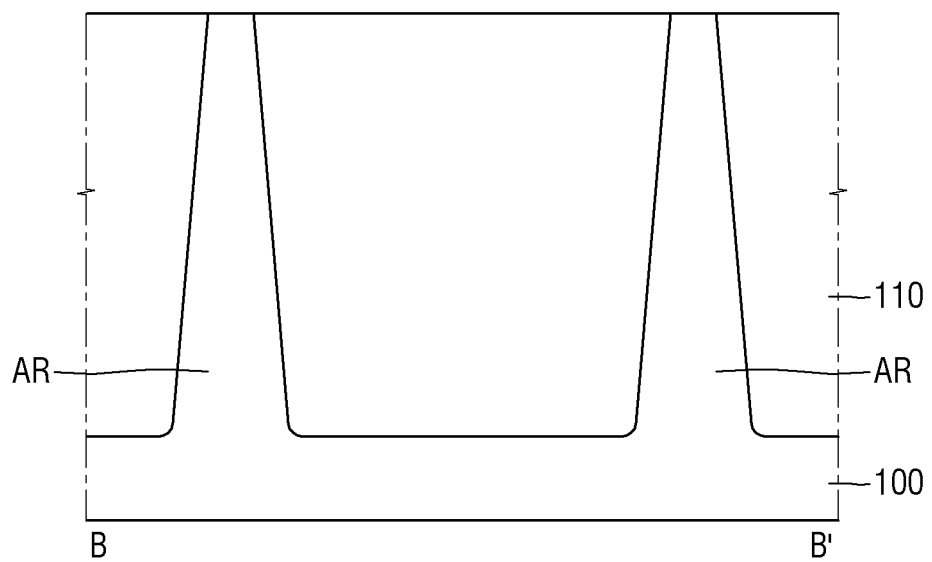

Referring to FIGS. 15 to 17, the active region AR and the isolation film 110 are formed in the substrate 100. For reference, FIG. 16 is a cross-sectional view taken along line A-A of FIG. 15, and FIG. 17 is a cross-sectional view taken along line B-B of FIG. 15.

The substrate 100 includes the active region AR. As illustrated in FIG. 15, the active region AR is formed in a plurality of bars extending in the first direction DR1. The active region AR includes an impurity region 105. The impurity region 105 may be formed by implanting impurities into the active region AR. At this time, the implantation of impurity may be performed, but is not limited to, by an ion implantation process. The present invention is not limited thereto. For example, the impurity region 105 may be formed by diffusing impurities into the active region AR.

The isolation film 110 is formed in the substrate 100. For example, a trench defining the active regions AR may be formed in the substrate 100, and an insulating film filling the trench may be formed. Therefore, the isolation film 110 defining the active regions AR is formed in the substrate 100.

Figure 18:
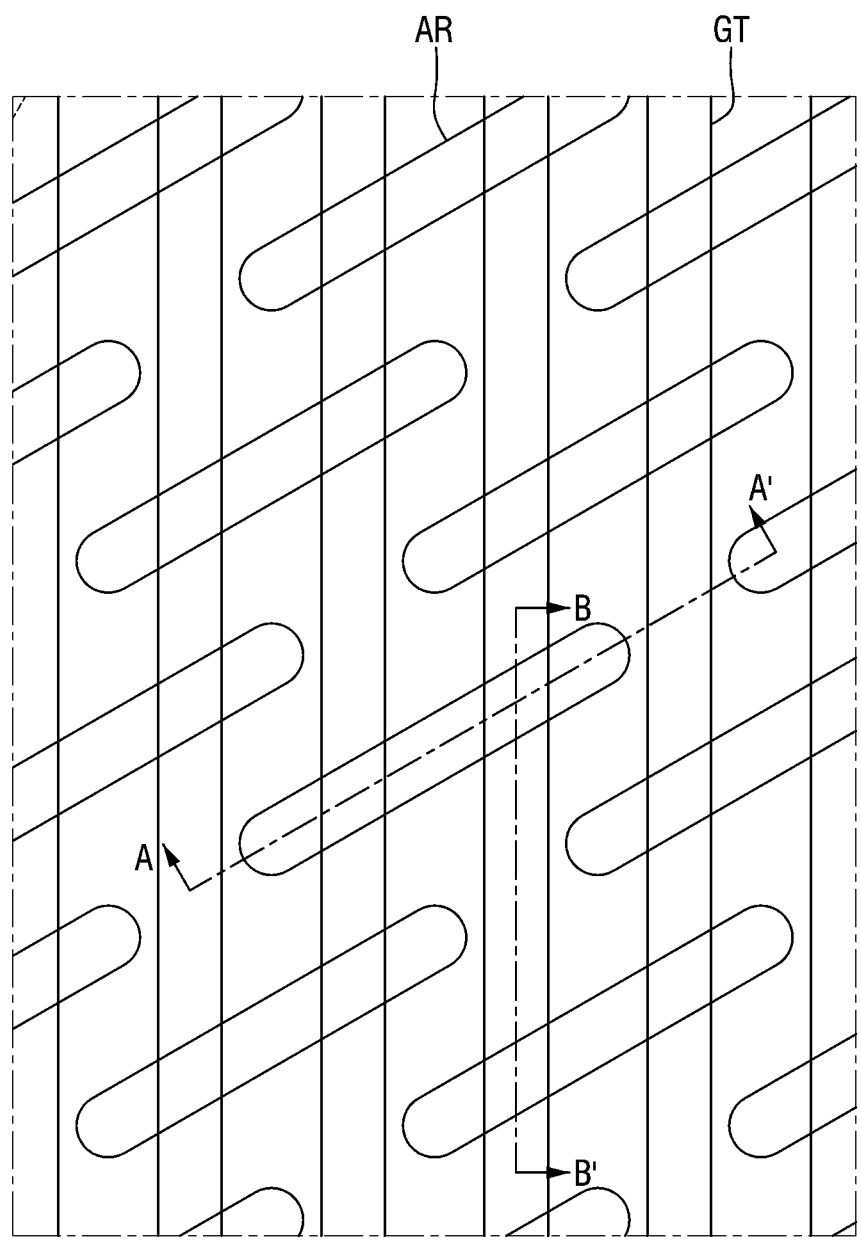
Figure 19:
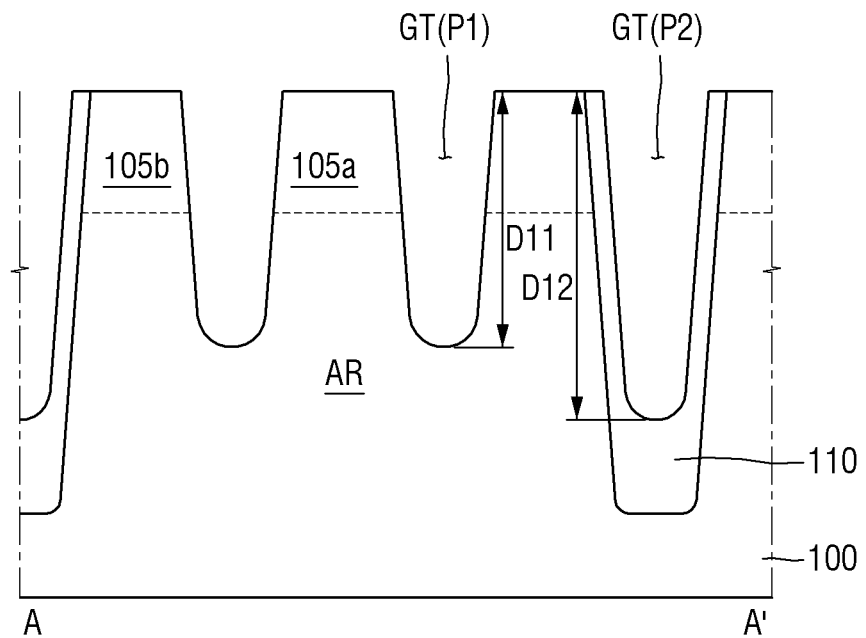
Figure 20:
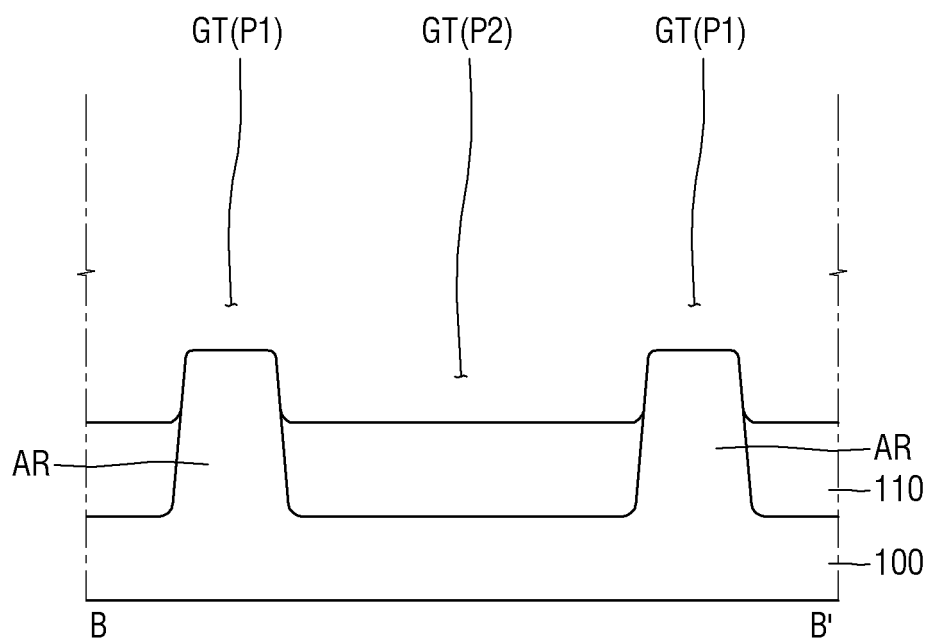

Referring to FIGS. 18 through 20, the gate trench GT is formed in the substrate 100. For reference, FIG. 19 is a cross-sectional view taken along line A-A of FIG. 18, and FIG. 20 is a cross-sectional view taken along line B-B of FIG. 18.

The gate trench GT is formed to cross the active region AR and the isolation film 110. For example, the gate trench GT is formed to extend in the second direction DR2. The gate trench GT includes a first trench P1 extending in the second direction DR2 inside the active region AR, and a second trench P2 extending in the second direction DR2 inside the isolation film 110. For example, the first trench P1 and the second trench P2 are connected to each other in the second direction DR2 and are alternately repeated in the second direction DR2.

The first trench P1 separates the impurity regions 105 of FIGS. 15 to 17. Thus, the first source/drain region 105a and the second source/drain region 105b are formed on one of the both sides of the first trench P1 and the other, respectively.

In some embodiments, the second trench P2 is formed to be deeper than the first trench P1. For example, as illustrated in FIG. 19, the depth D12 of the second trench P2 is deeper than the depth D11 of the first trench P1 with respect to the upper surface of the substrate 100.

Figure 21:
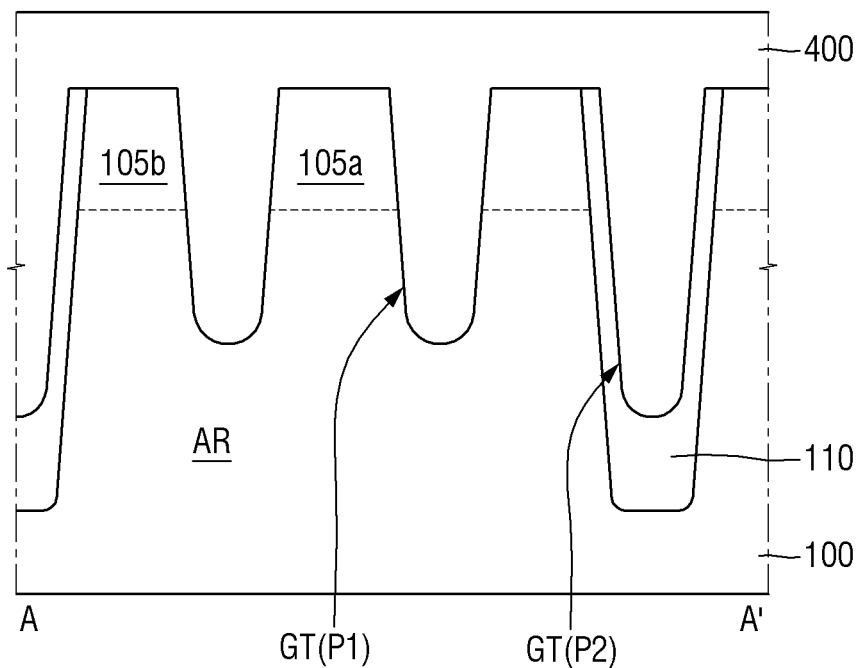
Figure 22:
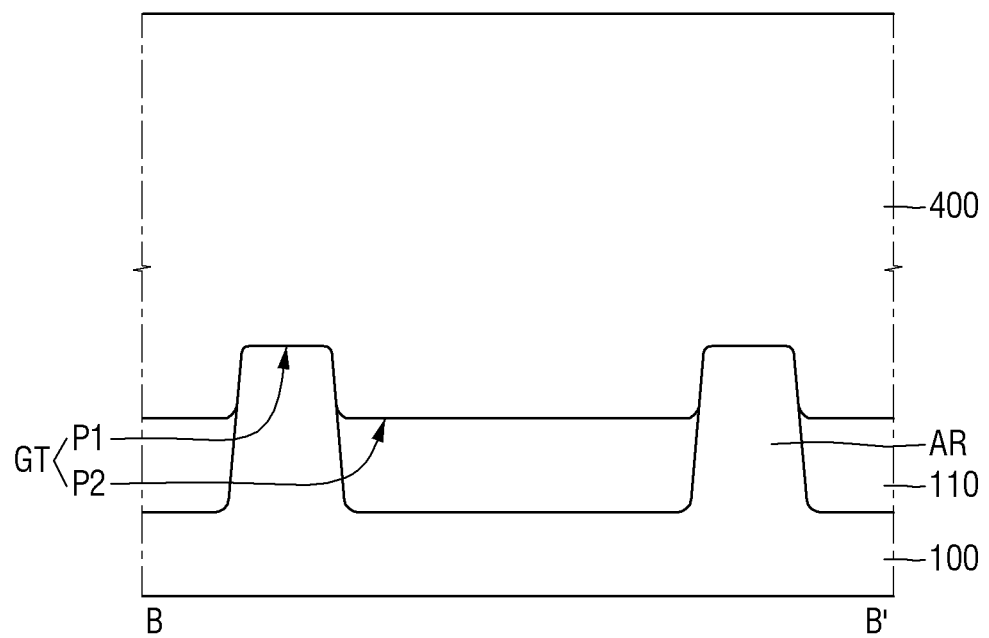

Referring to FIGS. 21 and 22, a sacrificial film 400 is formed on the substrate 100.

The sacrificial film 400 is formed to fill the gate trench GT. For example, the sacrificial film 400 fills the first trench P1 and the second trench P2.

The sacrificial film 400 may include a material having an etch selectivity with respect to a support structure 150 to be described below. The sacrificial film 400 may include, but is not limited to, for example, SOH (spin-on hard mask).

Figure 23:
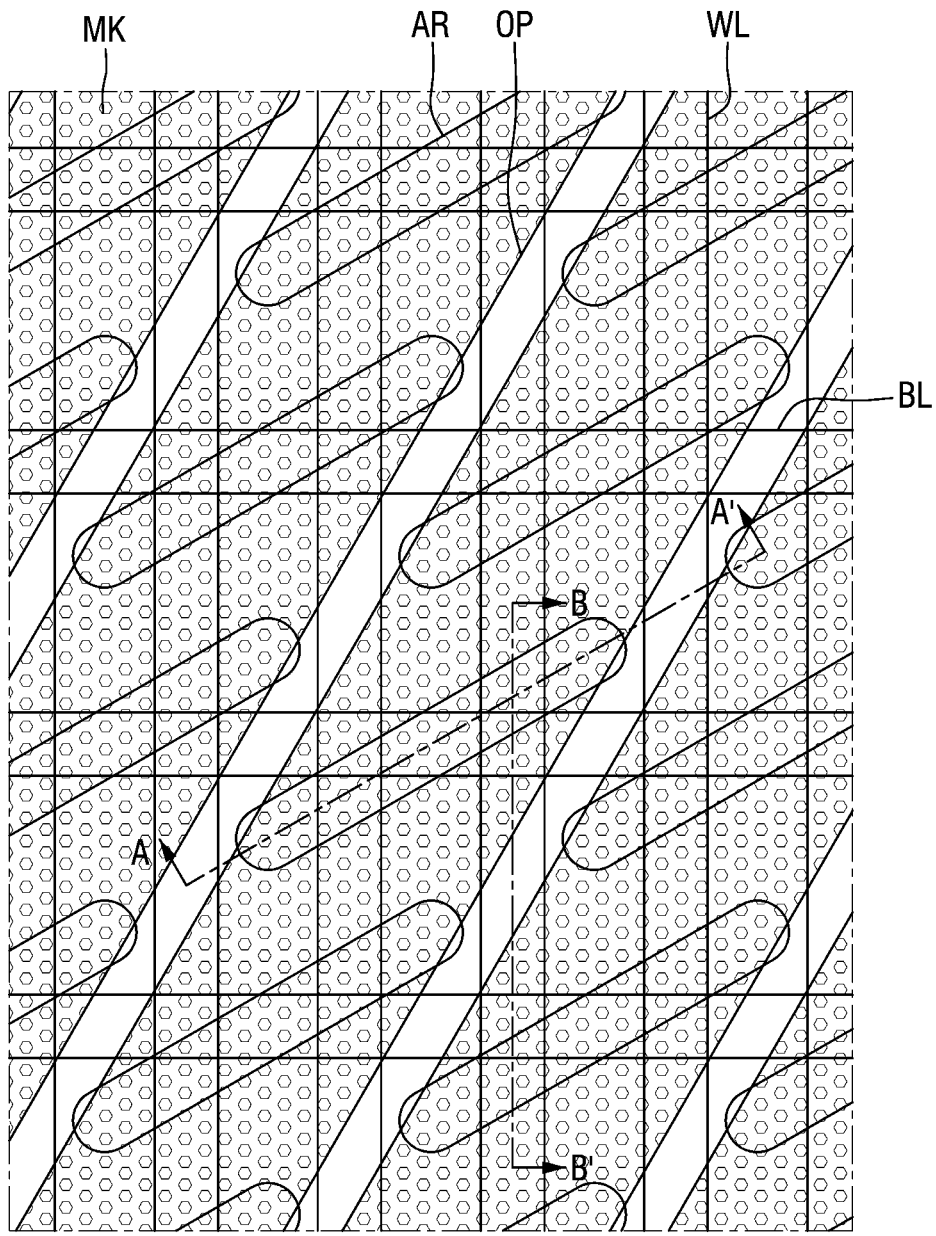
Figure 24:
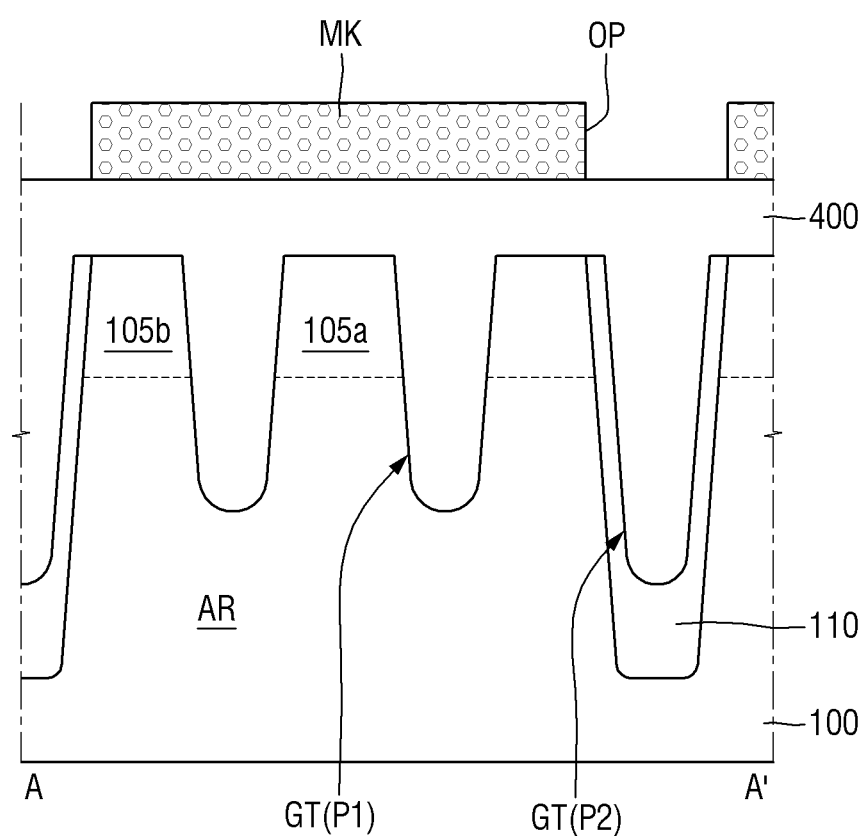
Figure 25:
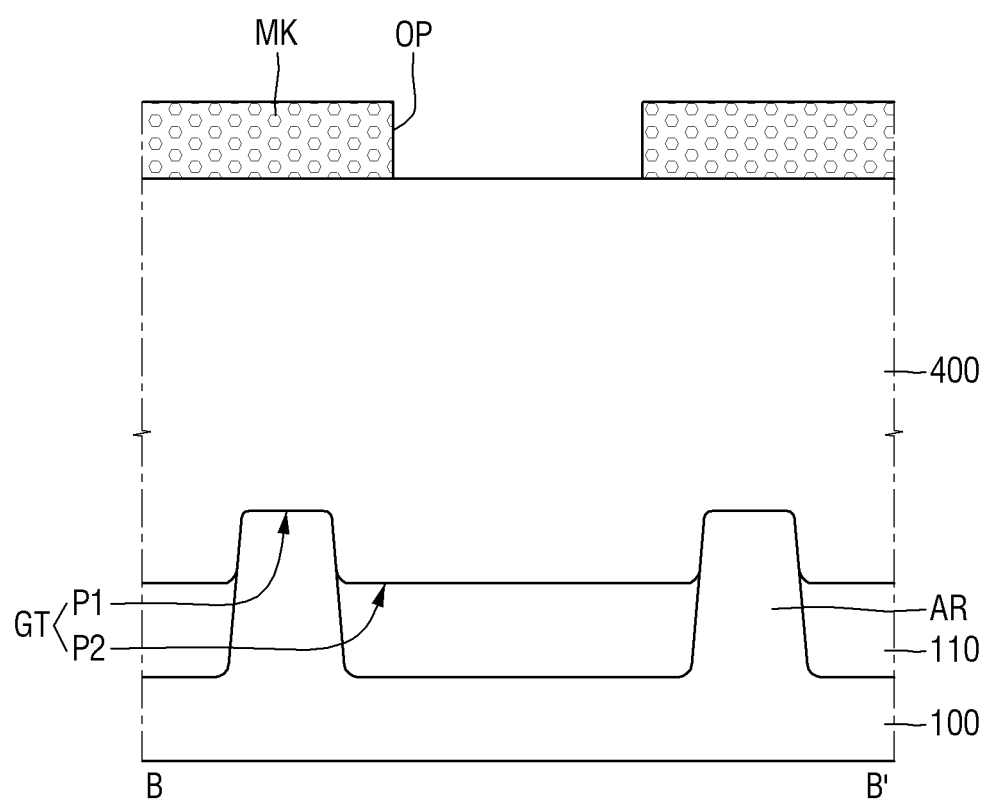

Referring also to FIGS. 23 to 25, a mask pattern MK is formed on the sacrificial film 400. For reference, FIG. 24 is a cross-sectional view taken along line A-A of FIG. 23, and FIG. 25 is a cross-sectional view taken along line B-B of FIG. 23.

The mask pattern MK includes an opening OP which exposes a part of the sacrificial film 400. The opening OP of the mask pattern MK exposes a part of the sacrificial film 400 on the isolation film 110.

In some embodiments, the opening OP of the mask pattern MK exposes the isolation film 110 between the two active regions AR arranged along the first direction DR1. For example, as illustrated in FIG. 23, the opening OP of the mask pattern MK passes through the isolation film 110 between the two active regions AR arranged along the first direction DR1, and extends long in the fourth direction DR4. The opening OP of the mask pattern MK overlaps the isolation film 110 between the two active regions AR arranged along the first direction DR1. The fourth direction DR4 forms a third acute angle θ3 with respect to the first direction DR1. In some embodiments, the third acute angle θ3 is smaller than the first acute angle θ1.

The formation of the mask pattern MK may be performed by, but is not limited to, for example, a self-aligned double patterning (SADP) process.

Figure 26:
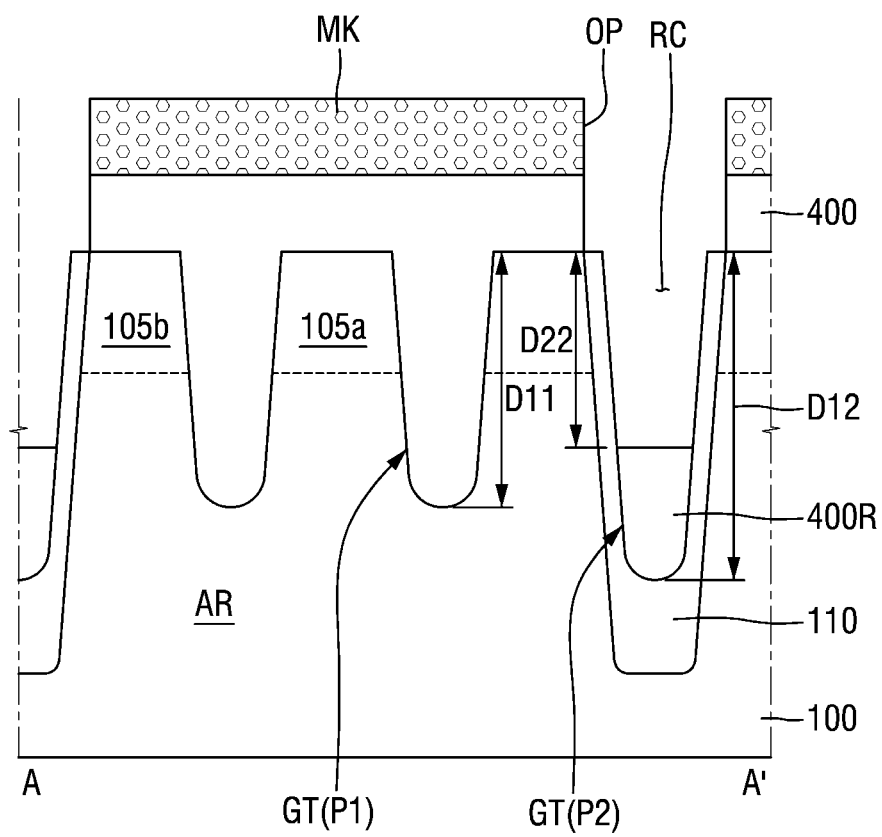
Figure 27:
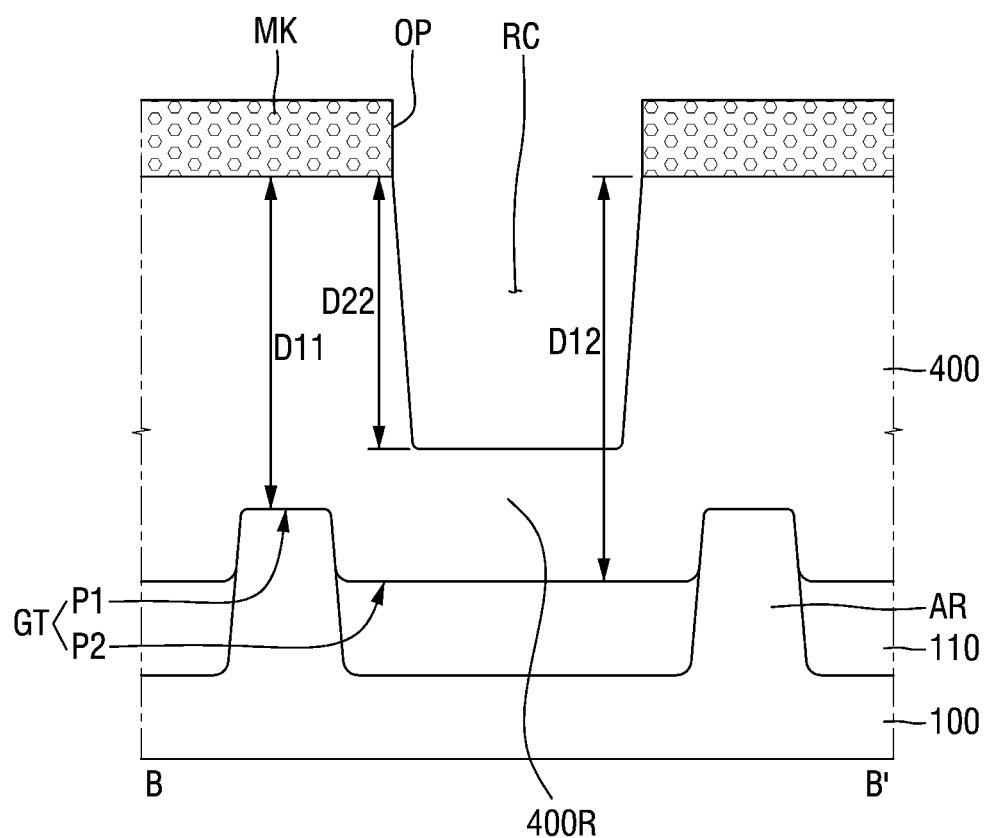

Referring to FIGS. 26 and 27, a part of the sacrificial film 400 exposed by the mask pattern MK is etched.

For example, an etching process which uses the mask pattern MK as an etching mask may be performed. As a result, the sacrificial film 400 exposed by the opening OP of the mask pattern MK may be etched.

However, in the aforementioned etching process, only a part of the sacrificial film 400 exposed by the opening OP of the mask pattern MK is etched. As a result, a part of the sacrificial film 400 remains in the second trench P2. The part of the sacrificial film 400 that remains in the second trench P2 may be referred to as a recessed sacrificial film 400R. Further, a recess RC in which a bottom surface is defined by the upper surface of the sacrificial film 400 is formed in the second trench P2. For example, the depth D22 of the upper surface (or the bottom surface of the recess RC) of the recessed sacrificial film 400R in the second trench P2 is shallower than the depth D12 of the bottom surface of the second trench P2 with respect to the upper surface of the substrate 100.

However, in some embodiments, the depth D22 of the bottom surface of the recess RC is deeper than the depth (D21 of FIG. 36) of the upper surface of the gate electrode 120, which will be described later, with respect to the upper surface of the substrate 100.

Figure 28:
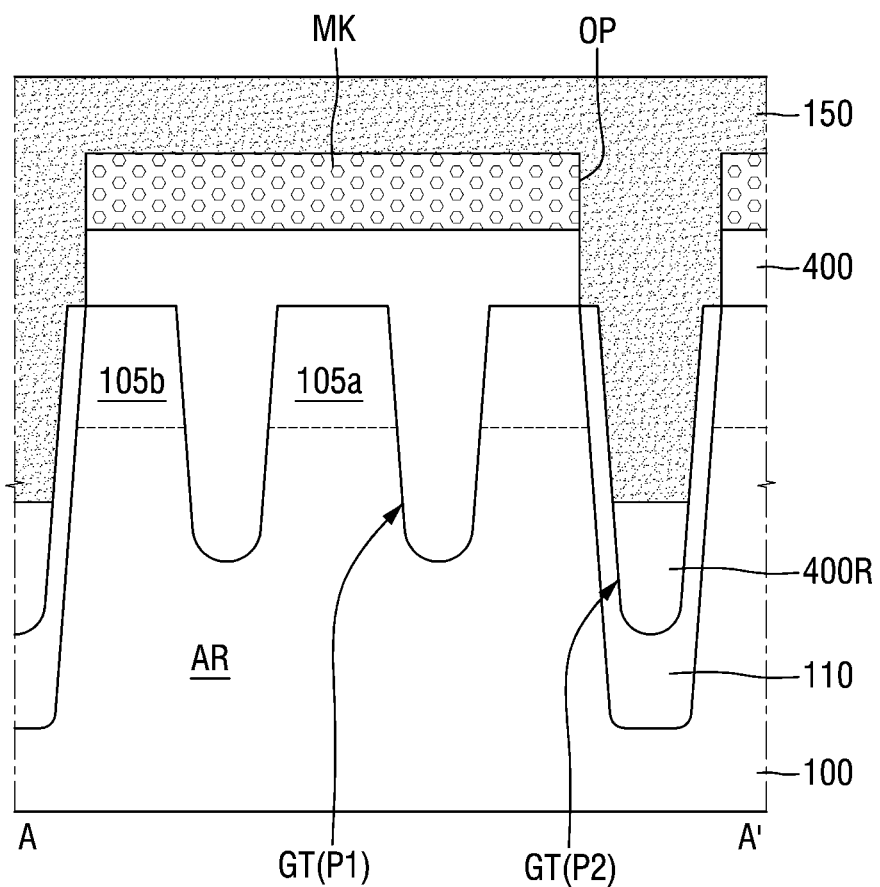
Figure 29:
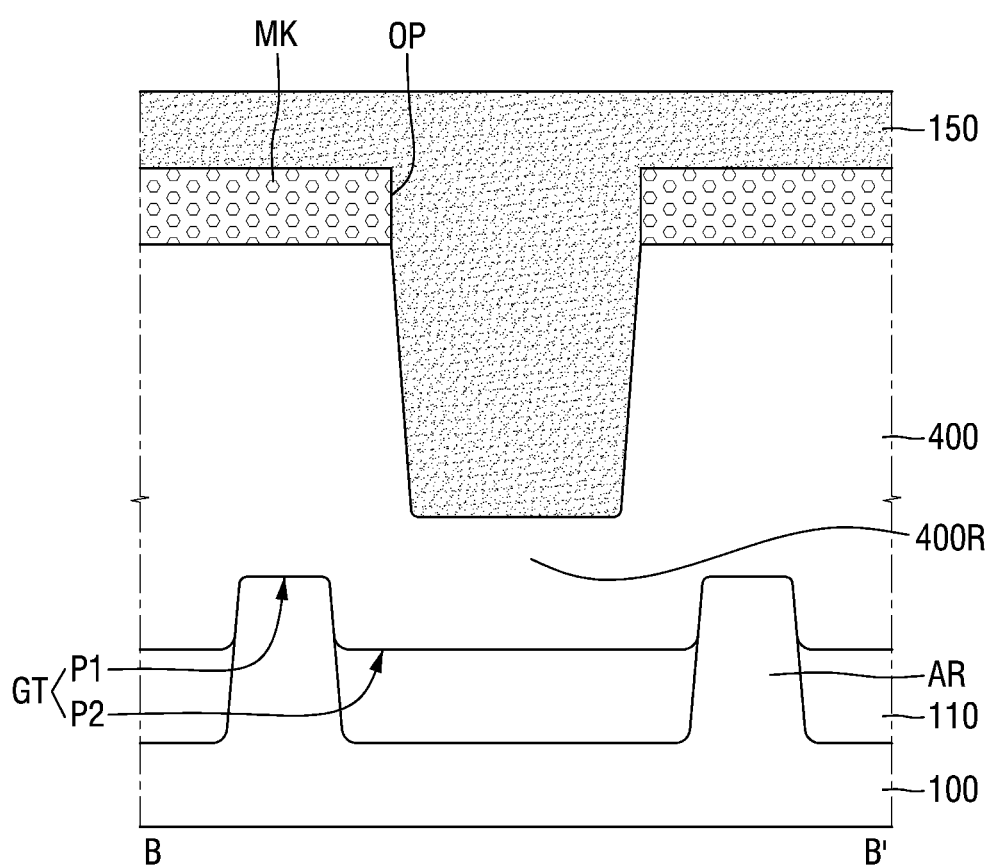

Referring to FIGS. 28 and 29, a support insulation film 150L is formed on the sacrificial film 400.

For example, the support insulation film 150L that fills the recess (RC of FIGS. 26 and 27) in the second trench P2 is formed. Therefore, the support insulation film 150L is formed on the part of the sacrificial film 400 in the second trench P2, i.e., the recessed sacrificial film 400R.

The support insulation film 150L may include, but is not limited to, at least one of, for example, silicon oxide, silicon nitride, silicon oxynitride, and combinations thereof. For convenience of explanation, the support insulation film 150L will be described to contain silicon nitride.

The support insulation film 150L is illustrated as being formed on the mask pattern MK, but this is only for convenience of explanation, and the present disclosure is not limited thereto. For example, in some embodiments, the mask pattern MK may be removed before the support insulation film 150L is formed.

Figure 30:
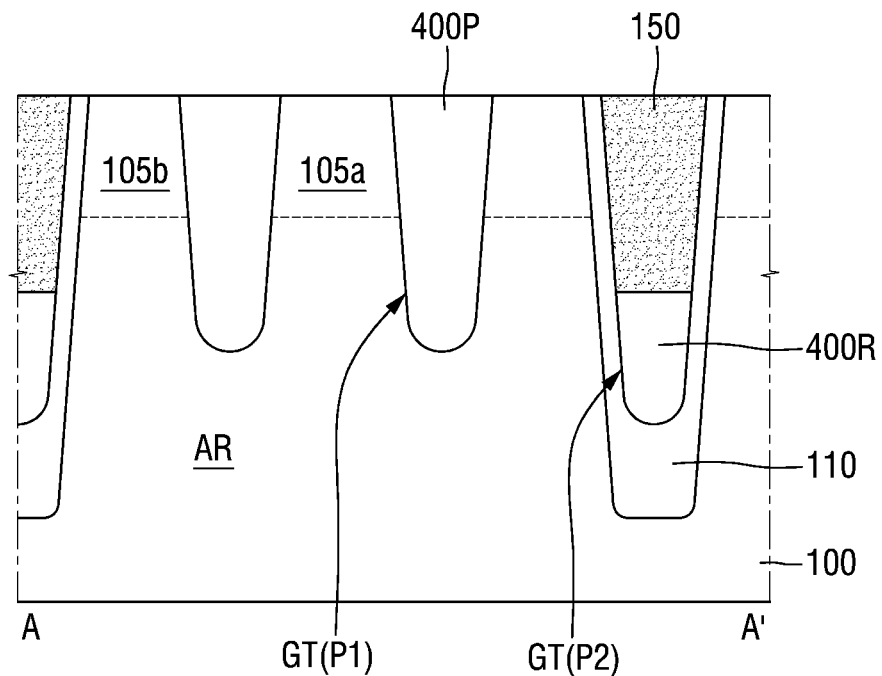
Figure 31:
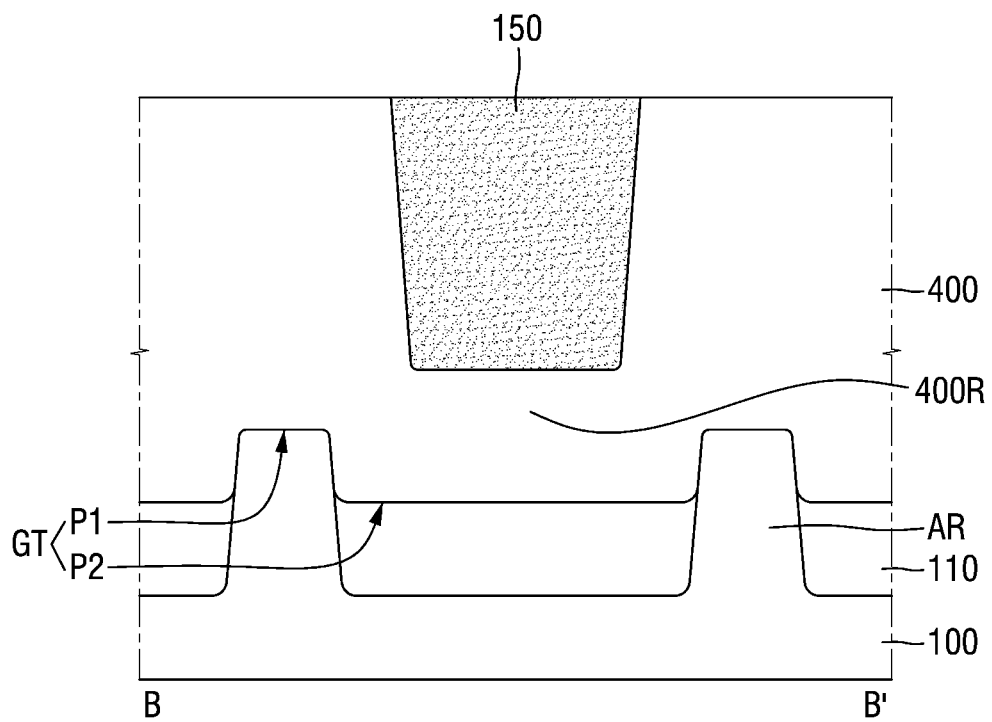

Referring to FIGS. 30 and 31, the support structure 150 is formed in the second trench P2.

For example, a planarization process of the support insulation film (150L of FIGS. 28 and 29) may be performed. The planarization process may be performed, for example, until the upper surface of the substrate 100 is exposed.

As a result, the sacrificial film 400 which fills the lower part of the second trench P2 and the first trench P1 is formed. The sacrificial film 400 that remains in the first trench P1 after the planarization process is performed may be referred to as a planarized sacrificial film 400P. Also, the support structure 150 which fills the upper part of the second trench P2 is formed. For example, the sacrificial film 400 which fills the upper part of the second trench P2 is replaced by the support structure 150. For example, a combined structure of the recessed sacrificial film 400 and the support structure 150 fills the second trench P2.

Figure 32:
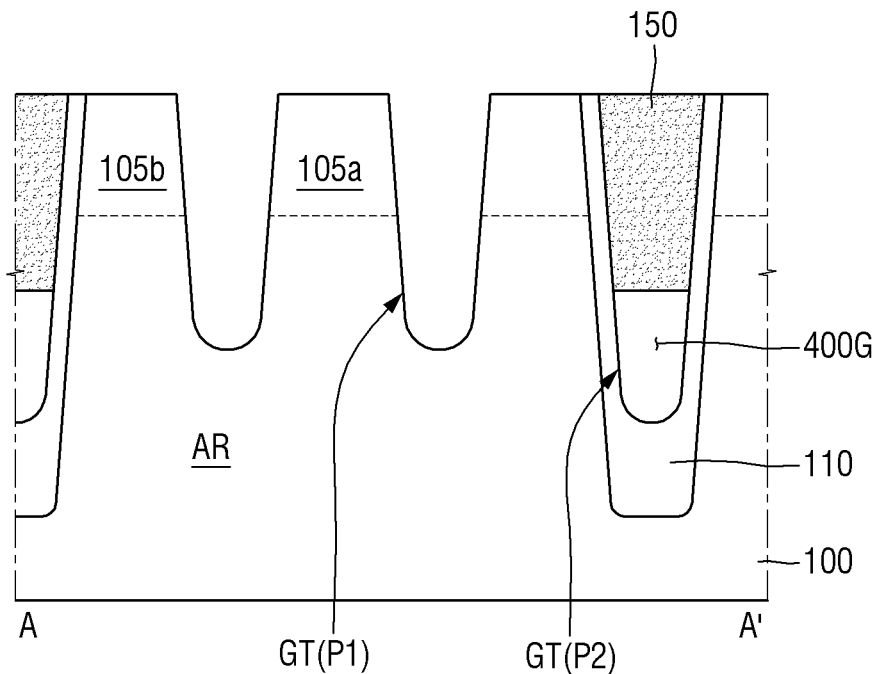
Figure 33:
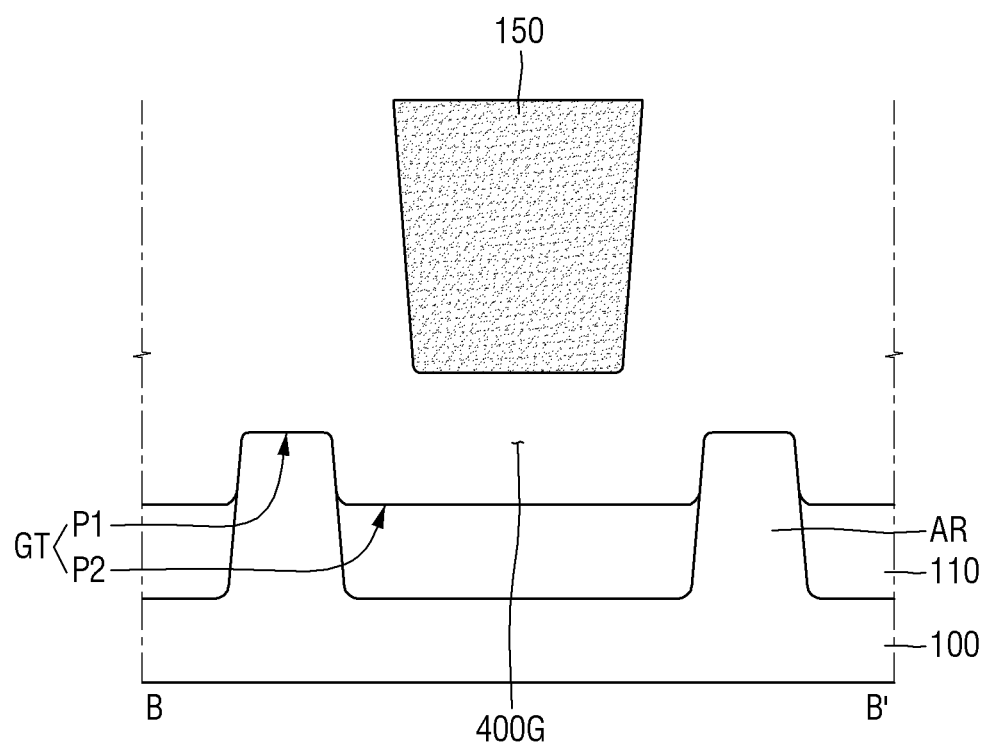

Referring to FIGS. 32 and 33, the sacrificial film 400 that remains after the etching process and the planarization process is removed. For example, the recessed sacrificial film 400R and the planarized sacrificial film 400P are removed to form a pass gate electrode gap 400G below the support structure 150.

For example, an ashing process and a strip process of the sacrificial film 400 may be performed. As described above, since the sacrificial film 400 may have an etch selectivity with respect to the support structure 150, the support structure 150 is not removed during removal of the sacrificial film 400.

As a result, the support structure 150 remains in the upper part of the second trench P2. Also, the pass gate electrode gap 400G is formed in the lower part of the second trench P2. For example, the lower part of the second trench P2 is disposed below the support structure 150.

Figure 34:
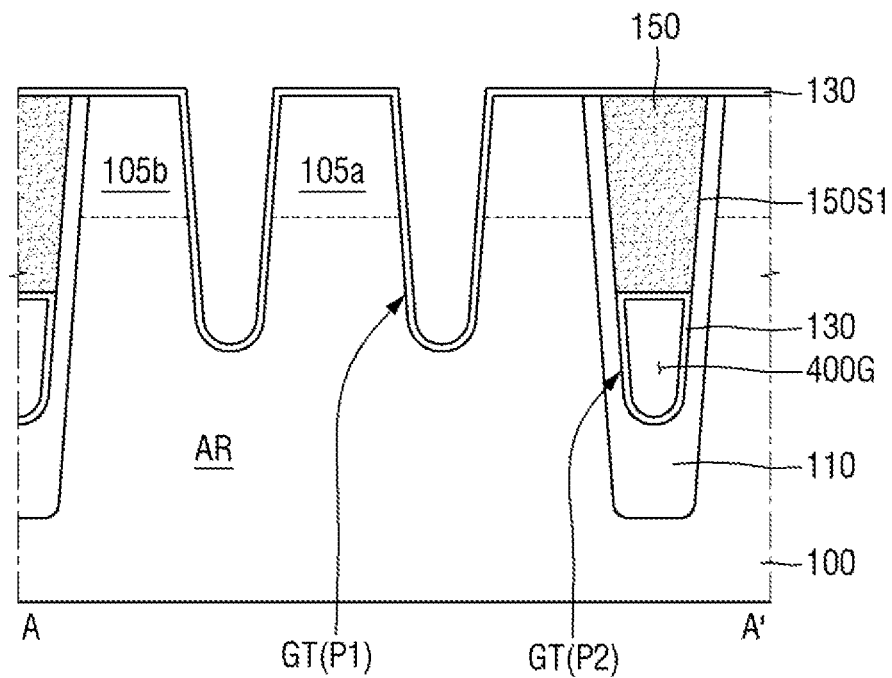
Figure 35:
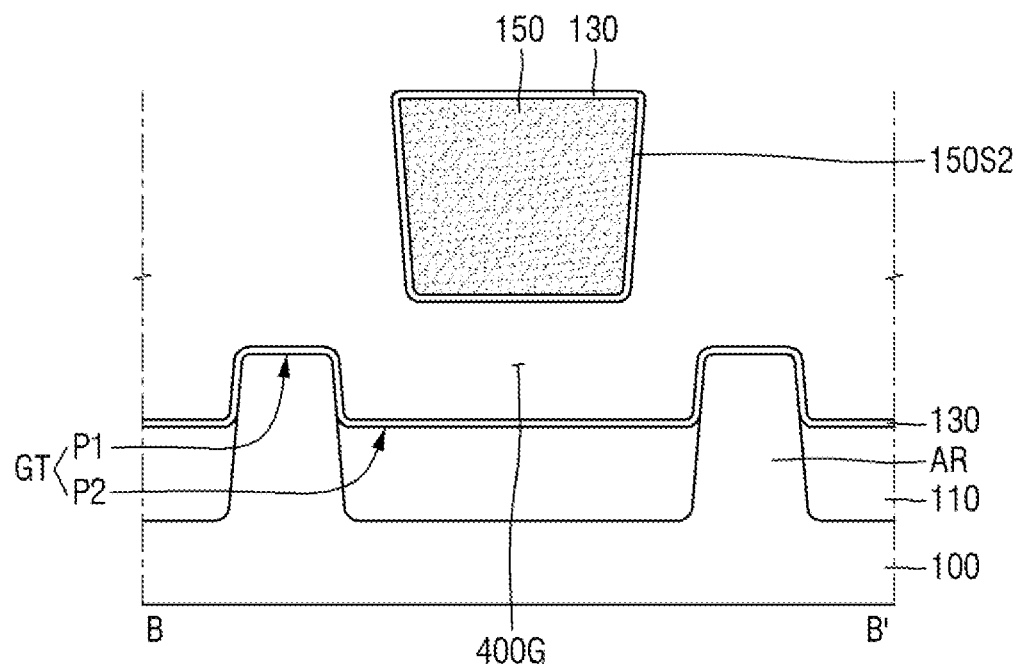

Referring to FIGS. 34 and 35, a gate insulating film 130 is formed in the gate trench GT.

For example, a gate insulating film 130 extending along the profile of the surface of the result product of FIGS. 32 and 33 is formed. For example, as illustrated in FIG. 34, the gate insulating film 130 extends along the upper surface of the substrate 100, the upper surface of the isolation film 110, the bottom surface and the sidewalls of the first trench P1, the bottom surface and the sidewalls of the second trench P2, and the bottom and upper surface of the support structure 150. Also, as illustrated in FIG. 35, the gate insulating film 130 further extends along the second sidewall 150S2 of the support structure 150. For example, the gate insulation film 130 is conformally formed using a deposition process.

Figure 36:
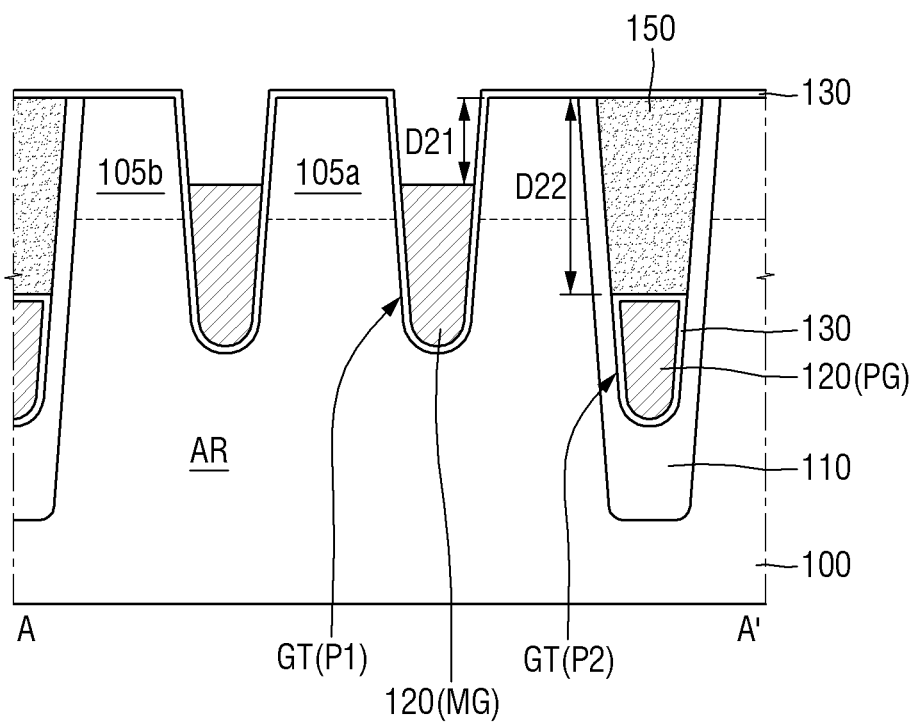
Figure 37:
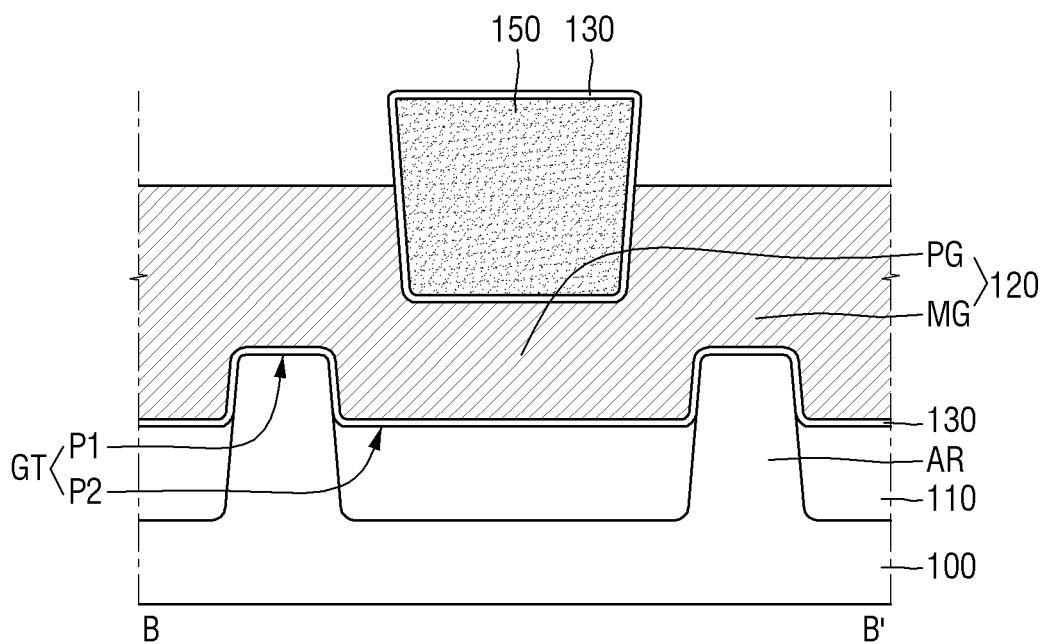

Referring to FIGS. 36 and 37, a gate electrode 120 which fills a part of the gate trench GT is formed.

For example, a conductive film that fills the gate trench GT may be formed, and a recess process of the conductive film may be performed. Therefore, the main gate electrode MG which fills the lower part of the first trench P1 and the pass gate electrode PG which fills the lower part of the second trench P2 are formed.

In some embodiments, the recess process is performed such that the depth D21 of the upper surface of the main gate electrode MG is smaller than the depth D22 of the bottom surface of the support structure 150 with respect to the upper surface of the substrate 100. For example, the upper surface of the main gate electrode MG is closer to the upper surface of the substrate 100 than the bottom surface of the support structure 150. The upper surface of the main gate electrode MG is also lower than the upper surface of the support structure 150. Thus, the pass gate electrode PG which fills the pass gate electrode gap (400G of FIGS. 34 and 35) is formed. Further, the pass gate electrode PG disposed to be deeper than the main gate electrode MG with respect to the upper surface of the substrate 100 is formed.

Figure 38:
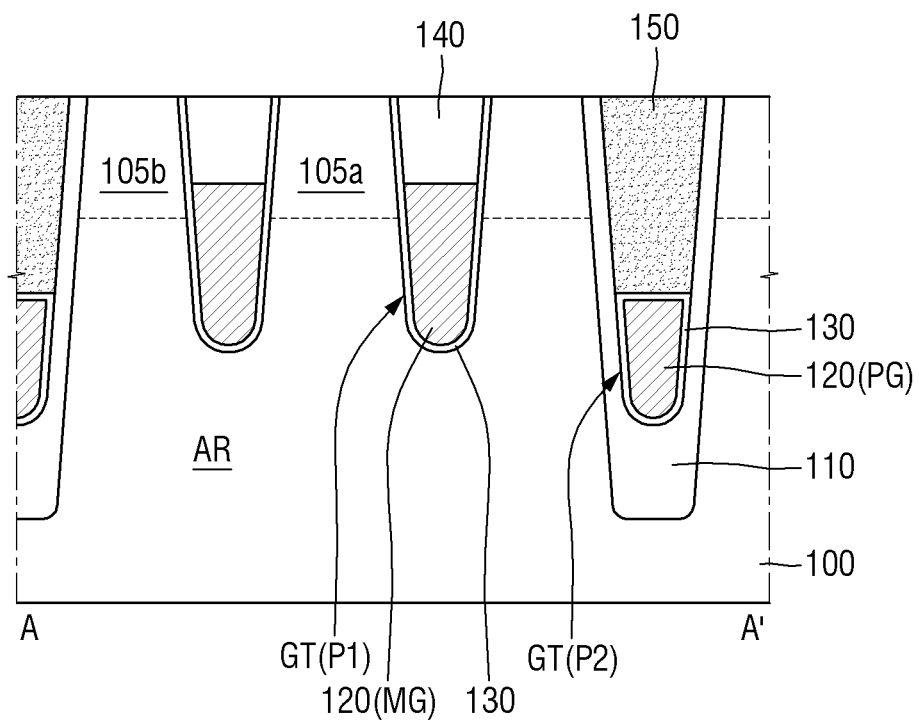
Figure 39:
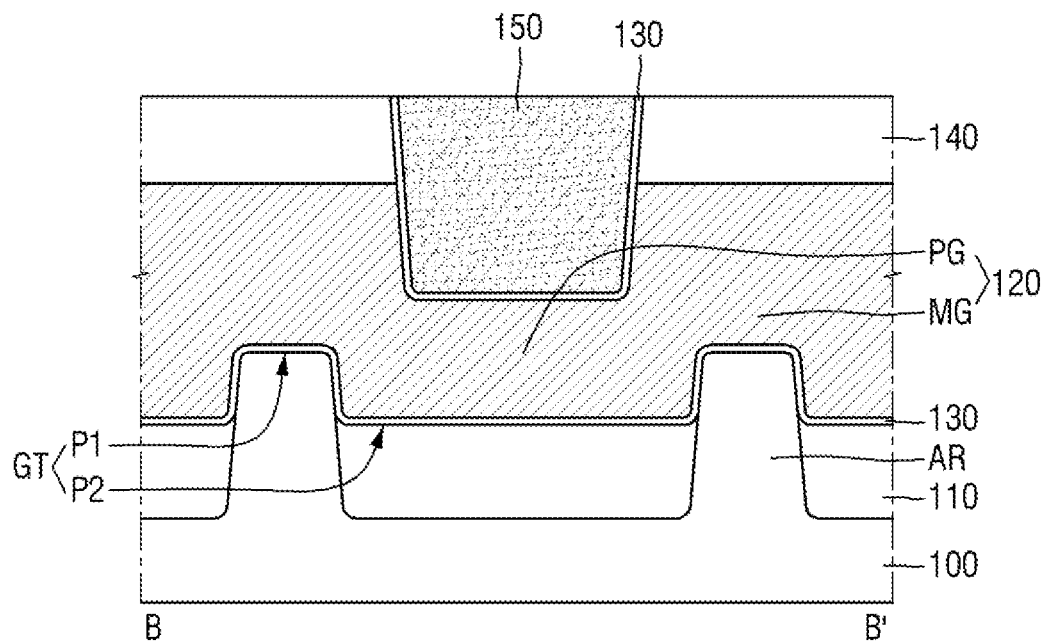

Referring to FIGS. 38 and 39, the capping pattern 140 is formed on the main gate electrode MG.

For example, an insulating film may be formed on the result product of FIGS. 36 and 37. Next, a planarization process of the insulating film may be performed. The planarization process may be performed on the insulating film, for example, until the upper surface of the substrate 100 is exposed. As a result, the capping pattern 140 which fills the upper part of the first trench P1 is formed.

Further, the upper surface of the substrate 100, the upper surface of the isolation film 110, and the upper surface of the support structure 150 are exposed. For example, a part of the gate insulating film 130 covering the upper surface of the substrate 100, the upper surface of the isolation film 110, and the upper surface of the support structure 150 is removed in the planarization process of the insulating film to expose the upper surfaces thereof.

Next, referring to FIGS. 2 and 4, a first interlayer insulating film 200, a second interlayer insulating film 210, a first contact structure 220, a second contact structure 230, a bit line BL and a capacitor structure 300 are formed on the substrate 100.

Accordingly, the semiconductor device mentioned above using FIGS. 1 to 4 can be fabricated.

In some embodiments, the method may further include formation of the barrier film 160 after formation of the gate insulating film 130 and before formation of the gate electrode 120. Thus, the semiconductor device mentioned above using FIGS. 5 and 6 can be fabricated.

In some embodiments, the method may further include formation of the inserting conductive film 170 after formation of the gate electrode 120 and before formation of the capping pattern 140. Thus, the semiconductor device mentioned above using FIGS. 7 and 8 can be fabricated.

In some embodiments, formation of the capping pattern 140 may include formation of the air gap 145 in the capping pattern 140. Accordingly, the semiconductor device mentioned above using FIGS. 9 and 10 can be fabricated.

In some embodiments, formation of the gate trench GT may include formation of a second trench P2 of which the width is smaller than that of the first trench P1. Thus, the semiconductor device mentioned above using FIG. 11 can be fabricated.

Figure 40:
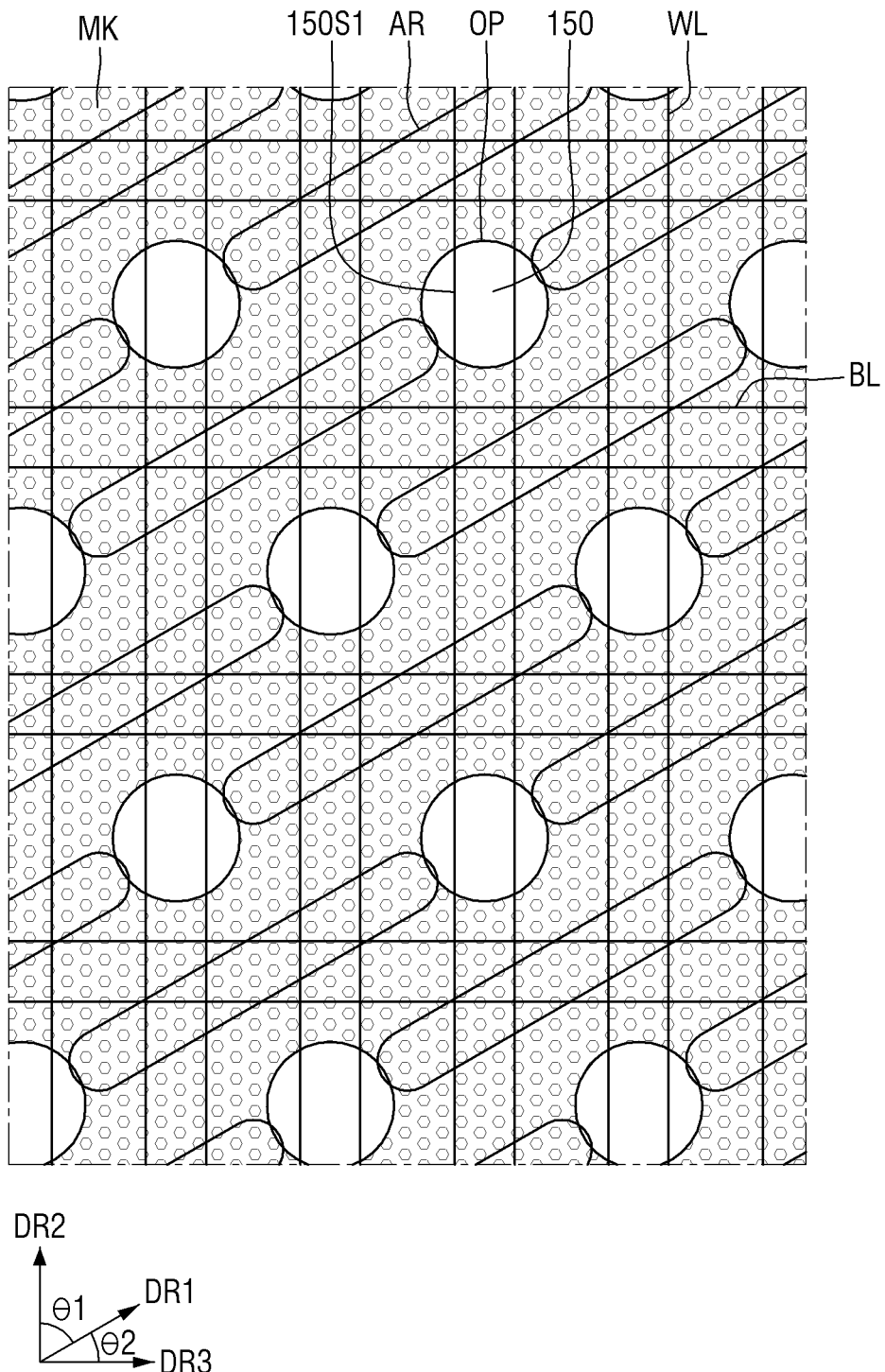
FIG. 40 is an intermediate step diagram for explaining a method for fabricating a semiconductor device according to some embodiments of the present inventive concept.

FIG. 40 is an intermediate step diagram for explaining a method for fabricating a semiconductor device according to some embodiments of the present inventive concept. For reference, FIG. 40 is a diagram for explaining the steps subsequent to FIG. 21 and FIG. 22. For the sake of convenience of explanation, repeated parts of those described using FIGS. 1 to 39 will be briefly explained or omitted.

Referring to FIG. 40, a mask pattern MK is formed on the sacrificial film 400.

In some embodiments, the opening OP of the mask pattern MK may include a plurality of circular openings. For example, the opening OP of the mask pattern MK may include a plurality of circular openings that exposes the isolation film 110 between the two active regions AR arranged along the first direction DR1.

Subsequently, the steps of FIGS. 26 to 39 may be executed. Thus, the semiconductor device described above using FIG. 12 can be fabricated.

Figure 41:
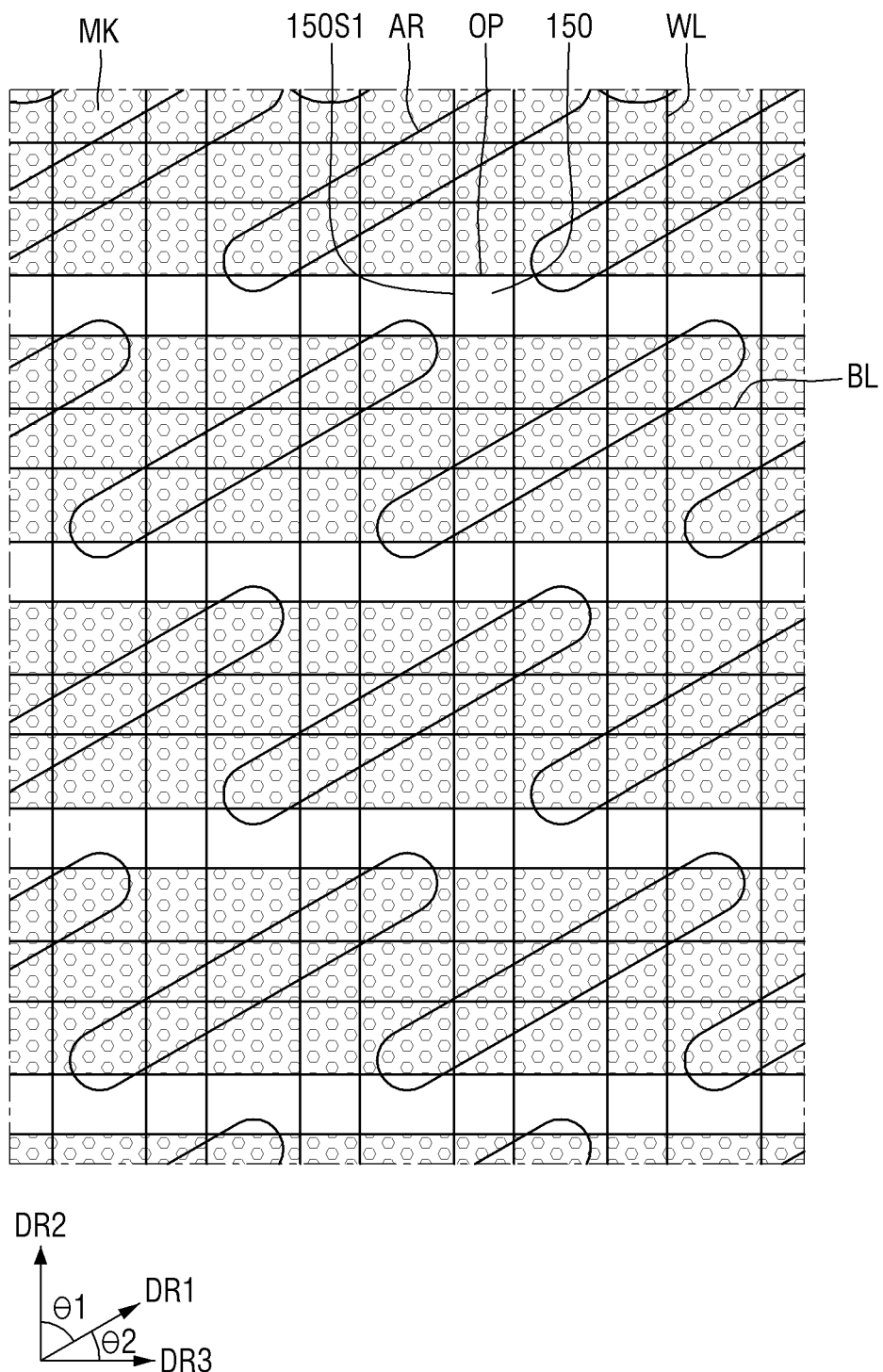
FIG. 41 is an intermediate step diagram for explaining a method for fabricating a semiconductor device according to some embodiments of the present inventive concept.

FIG. 41 is an intermediate step diagram for explaining a method for fabricating a semiconductor device according to some embodiments of the present inventive concept. For reference, FIG. 41 is a diagram for explaining the steps subsequent to FIGS. 21 and 22. For the sake of convenience of explanation, repeated parts of those described using FIGS. 1 to 39 will be briefly explained or omitted.

Referring to FIG. 41, the mask pattern MK is formed on the sacrificial film 400.

In some embodiments, the opening OP of the mask pattern MK extends long along the third direction DR3. For example, the opening OP of the mask pattern MK passes through the isolation film 110 between the two active regions AR arranged along the first direction DR1, and extends long along the third direction DR3. The opening OP of the mask pattern MK overlaps the isolation film 110 between the two active regions AR arranged along the first direction DR1.

Subsequently, the steps of FIGS. 26 to 39 may be executed. Therefore, the semiconductor device described above using FIG. 13 can be fabricated.

Figure 42:
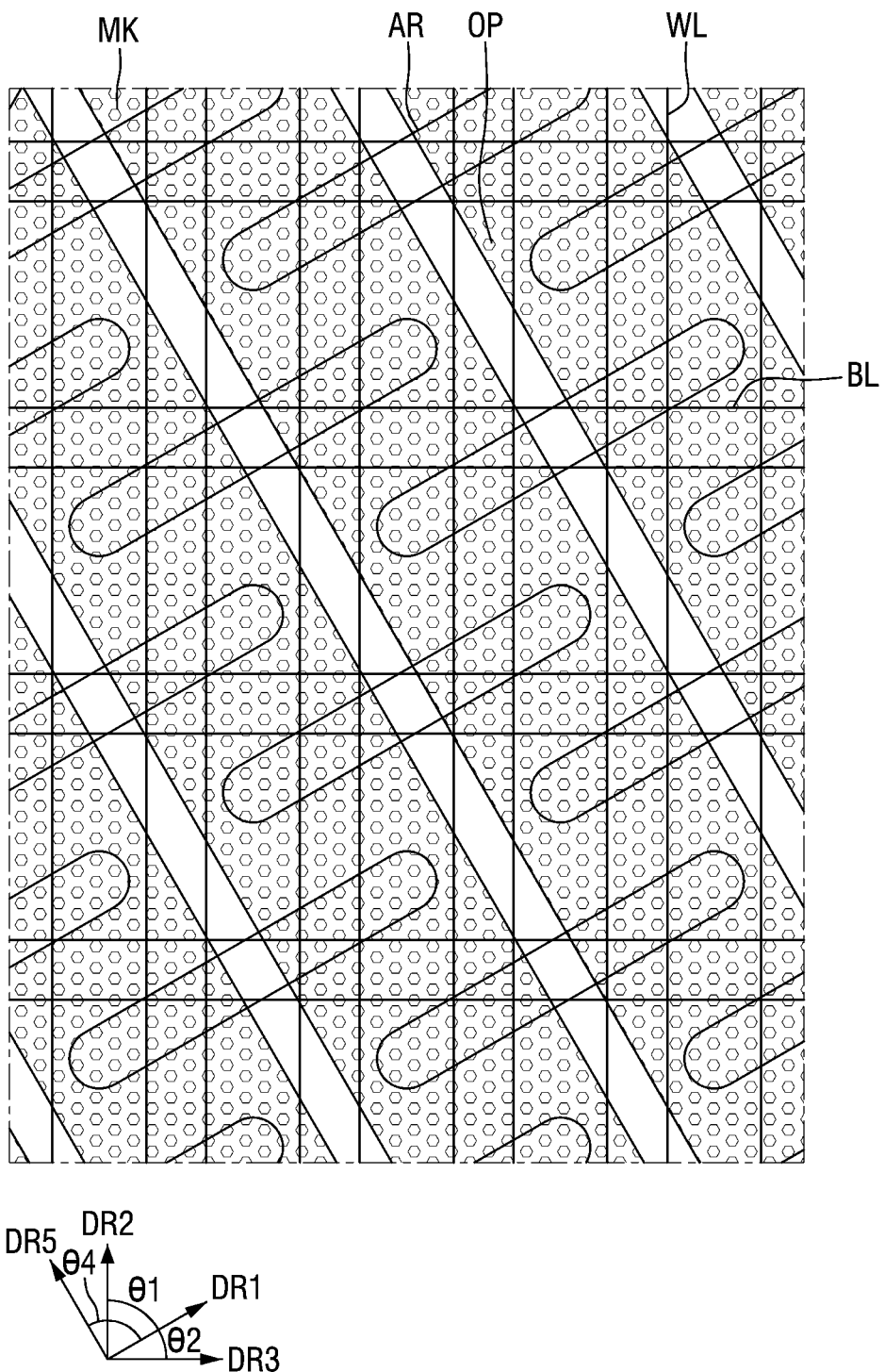
FIG. 42 is an intermediate step diagram for explaining a method for fabricating a semiconductor device according to some embodiments of the present inventive concept.

FIG. 42 is an intermediate step diagram for explaining a method for fabricating a semiconductor device according to some embodiments of the present inventive concept. For reference, FIG. 42 is a diagram for explaining the steps subsequent to FIGS. 21 and 22. For the sake of convenience of explanation, repeated parts of those described using FIGS. 1 to 39 will be briefly explained or omitted.

Referring to FIG. 42, the mask pattern MK is formed on the sacrificial film 400.

In some embodiments, the opening OP of the mask pattern MK extends long along the fifth direction DR5. For example, the opening OP of the mask pattern MK passes through the isolation film 110 between the two active regions AR arranged along the first direction DR1, and extends long in the fifth direction DR5. The opening OP of the mask pattern MK overlaps the isolation film 110 between the two active regions AR. In some embodiments, the first angle θ4 is greater than the first acute angle θ1.

Subsequently, the steps of FIGS. 26 to 39 may be executed. Thus, the semiconductor device described above using FIG. 14 can be fabricated.

In concluding the detailed description, those skilled in the art will appreciate that many variations and modifications may be made to the embodiments without substantially departing from the principles of the present inventive concept. Therefore, the disclosed embodiments of the invention are used in a generic and descriptive sense only and not for purposes of limitation.

What is claimed is:

1. A semiconductor device comprising:
an active region in a substrate;
an isolation film which defines the active region in the substrate;
a gate trench which extends across the active region and the isolation film, and includes a first trench in the active region and a second trench in the isolation film;
a gate electrode which includes a main gate electrode and a pass gate electrode, the main gate electrode filling a lower part of the first trench, and the pass gate electrode filling a lower part of the second trench;
a support structure on the pass gate electrode, the support structure filling an upper part of the second trench; and
a gate insulating film including a first portion interposed between the isolation film and the pass gate electrode and a second portion interposed between the support structure and the pass gate electrode,
wherein the gate insulating film extends along a sidewall of the main gate electrode.

2. The semiconductor device of claim 1, further comprising:
a capping pattern on the main gate electrode, the capping pattern filling an upper part of the first trench,
wherein the gate insulating film further extends along a sidewall of the capping pattern,
wherein the gate insulating film extends along a sidewall of the main gate electrode,
wherein a top surface of the second portion contacts a bottom surface of the support structure, and
wherein a width of the top surface of the second portion is the same as a width of the bottom surface of the support structure.

3. The semiconductor device of claim 2,
wherein the capping pattern contacts an upper surface of the main gate electrode.

4. The semiconductor device of claim 1,
wherein the gate insulating film extends along a sidewall of the pass gate electrode between the sidewall of the pass gate electrode and a lower inner sidewall of the second trench, and
wherein the support structure contacts an upper inner sidewall of the second trench.

5. The semiconductor device of claim 1,
wherein a bottom surface of the second trench is lower than a bottom surface of the first trench with respect to an upper surface of the substrate.

6. The semiconductor device of claim 1,
wherein an upper surface of the pass gate electrode is lower than an upper surface of the main gate electrode with respect to an upper surface of the substrate.

7. The semiconductor device of claim 1,
wherein a width of the second trench at a first depth thereof from an upper surface of the substrate is smaller than a width of the first trench at a second depth thereof from the upper surface of the substrate, and
wherein the first depth and the second depth are the same.

8. The semiconductor device of claim 1, further comprising:
a barrier film interposed between the gate insulating film and the gate electrode.

9. The semiconductor device of claim 8,
wherein the barrier film extends along a bottom surface and a sidewall of the main gate electrode, and extends along a bottom surface, a sidewall, and an upper surface of the pass gate electrode.

10. A semiconductor device comprising:
an active region which includes a first trench extending in a first direction inside a substrate;
an isolation film which includes a second trench extending in the first direction inside the substrate, and defines the active region;
a main gate electrode which fills a lower part of the first trench;
a first gate insulating film between the active region and the main gate electrode;
a pass gate electrode which fills a lower part of the second trench;
a second gate insulating film between the isolation film and the pass gate electrode; and
a support structure on the pass gate electrode, the support structure filling an upper part of the second trench,
wherein the first gate insulating film extends along a bottom surface and a sidewall of the main gate electrode,
wherein the second gate insulating film includes a first portion extending along a bottom surface and a sidewall of the pass gate electrode, and a second portion extending along an upper surface of the pass gate electrode,
wherein a top surface of the second portion of the second gate insulating film contacts a bottom surface of the support structure, and
wherein a width of the top surface of the second portion of the second gate insulating film is the same as a width of the bottom surface of the support structure.

11. The semiconductor device of claim 10, further comprising:
a capping pattern on the main gate electrode, the capping pattern filling an upper part of the first trench.

12. The semiconductor device of claim 11,
wherein the first gate insulating film further extends along a sidewall of the capping pattern, and
the support structure contacts an inner sidewall of the upper part of the second trench.

13. The semiconductor device of claim 11,
wherein the bottom surface of the support structure is lower than a bottom surface of the capping pattern with respect to an upper surface of the substrate.

14. The semiconductor device of claim 11, further comprising:
an inserting conductive film between the main gate electrode and the capping pattern, the inserting conductive film including a material different from a material of the main gate electrode.

15. The semiconductor device of claim 11,
wherein the capping pattern contacts an upper surface of the main gate electrode.

16. The semiconductor device of claim 10, further comprising:
a source/drain region in the active region adjacent to the first trench; and
a bit line connected to the source/drain region and extending in a second direction intersecting the first direction.

17. The semiconductor device of claim 10, further comprising:
a source/drain region in the active region between the first trench and the second trench; and
a capacitor structure connected to the source/drain region.

18. A semiconductor device comprising:
- an active region extending in a first direction inside a substrate;
- an isolation film which defines the active region inside the substrate;
- a gate trench in the active region and the isolation film, the gate trench extending in a second direction at a first acute angle with respect to the first direction;
- a gate electrode which fills a lower part of the gate trench;
- a support structure on the gate electrode, the support structure filling an upper part of the gate trench in the isolation film, on the gate electrode; and
- a gate insulating film which extends along sidewalls and a bottom surface of the gate trench,
- wherein the support structure includes a first sidewall intersecting the second direction, and
- the gate insulating film further extends along a bottom surface and the first sidewall of the support structure,
- wherein the first sidewall of the support structure extends in a third direction at a second acute angle with respect to the first direction, and
- wherein the second acute angle is smaller than the first acute angle.

19. The semiconductor device of claim 18, further comprising:
- a capping pattern on the gate electrode, the capping pattern filling an upper part of the gate trench in the active region,
- wherein a part of the gate insulating film is interposed between the first sidewall of the support structure and a sidewall of the capping pattern.

* * * * *